(12) United States Patent
Polivka

(10) Patent No.: US 9,164,133 B2
(45) Date of Patent: Oct. 20, 2015

(54) SWITCHED AVERAGING ERROR AMPLIFIER

(71) Applicant: Power Integrations, Inc., San Jose, CA (US)

(72) Inventor: William M. Polivka, Campbell, CA (US)

(73) Assignee: Power Integrations, Inc., San Jose, CA (US)

( * ) Notice: Subject to any disclaimer, the term of this patent is extended or adjusted under 35 U.S.C. 154(b) by 434 days.

(21) Appl. No.: 13/668,012

(22) Filed: Nov. 2, 2012

(65) Prior Publication Data
US 2014/0126249 A1 May 8, 2014

(51) Int. Cl.
H02M 3/158 (2006.01)
H02M 3/335 (2006.01)
H02M 1/00 (2007.01)
G01R 19/10 (2006.01)

(52) U.S. Cl.
CPC ............. *G01R 19/10* (2013.01); *H02M 3/158* (2013.01); *H02M 3/33523* (2013.01); *H02M 2001/0025* (2013.01)

(58) Field of Classification Search
USPC ................................. 327/142, 100
See application file for complete search history.

(56) References Cited

U.S. PATENT DOCUMENTS

| | | | | |
|---|---|---|---|---|
| 7,184,283 | B2* | 2/2007 | Yang et al. | 363/41 |
| 7,663,379 | B2* | 2/2010 | Nehrig et al. | 324/678 |
| 7,944,411 | B2* | 5/2011 | Saeki | 345/76 |
| 8,159,843 | B2* | 4/2012 | Lund et al. | 363/56.01 |
| 8,194,425 | B2* | 6/2012 | Park et al. | 363/21.18 |
| 2006/0034102 | A1 | 2/2006 | Yang et al. | |
| 2006/0192598 | A1* | 8/2006 | Baird et al. | 327/100 |
| 2007/0103134 | A1 | 5/2007 | Yang et al. | |
| 2007/0133234 | A1 | 6/2007 | Huynh et al. | |
| 2008/0031018 | A1* | 2/2008 | Negrete | 363/21.17 |
| 2008/0043496 | A1 | 2/2008 | Yang | |
| 2009/0033307 | A1* | 2/2009 | Park et al. | 323/293 |
| 2009/0160415 | A1* | 6/2009 | Polivka | 323/284 |
| 2009/0237133 | A1* | 9/2009 | Yang | 327/161 |
| 2009/0290390 | A1* | 11/2009 | Piper | 363/21.04 |
| 2010/0194367 | A1* | 8/2010 | Lund et al. | 323/284 |
| 2010/0289463 | A1 | 11/2010 | Wang et al. | |
| 2012/0069611 | A1* | 3/2012 | Yang et al. | 363/44 |
| 2012/0230064 | A1* | 9/2012 | Yang et al. | 363/21.15 |
| 2012/0243263 | A1* | 9/2012 | Katsushima et al. | 363/16 |
| 2013/0027996 | A1* | 1/2013 | Baurle et al. | 363/78 |

OTHER PUBLICATIONS

U.S. Appl. No. 13/527,335, filed Jun. 19, 2012, Guangchao Zhang.

* cited by examiner

Primary Examiner — Nguyen Tran
Assistant Examiner — Bryan R Perez
(74) Attorney, Agent, or Firm — Blakely Sokoloff Taylor & Zafman LLP

(57) ABSTRACT

A signal averaging circuit includes a plurality of switched weighted current sources to generate a total amount of charge. The total amount of charge is representative of a weighted sum of a plurality of input signal samples during an active period of a read enable signal. A timing control signal generator is coupled to receive an input signal and the read enable signal and sequentially switch the plurality of switched weighted current sources to adjust the total amount of charge in response to the input signal during the active period of the read enable signal. A storage circuit is coupled to the plurality of switched weighted current sources to convert the total amount of charge into a voltage representative of an output signal.

23 Claims, 13 Drawing Sheets

SWITCHED AVERAGING ERROR AMPLIFIER

BACKGROUND INFORMATION

1. Field of the Disclosure

The present invention relates generally to power converters. More specifically, examples of the present invention are related to switching power converters that utilize an error amplifier in a feedback loop to regulate an output.

2. Background

Many electronic devices such as cell phones, laptop computers, etc., use direct current (dc) power to operate. Conventional wall outlets generally deliver a high voltage alternating current (ac) power that needs to be transformed to dc power in order to be used as a power source by most electronic devices. Switched mode power supplies are commonly used due to their high efficiency, small size, and low weight to convert the high voltage ac power to a regulated dc power. In operation, a switch is used to provide a desired output by either switching at a variable duty ratio (typically the ratio of on-time of the switch to total switching period) or by varying the number of ON and OFF cycles per unit time.

A switched mode power supply also employs a controller, which typically provides output regulation by sensing the output and controlling the switch in a closed loop. The controller may receive a feedback signal representative of the output and then vary one of the control parameters (such as for example duty ratio, or for example the number of ON and OFF cycles of the switch per unit time) in response to the feedback signal to regulate the output of the power supply to a desired quantity.

One practical consideration in the design of a controller is the accuracy with which the feedback signal represents the output of the power supply. This is because as the feedback signal tracks the output of the power supply with less deviation from the ideal value, the controller can react with greater accuracy to the changes at the output, which then results in tighter output regulation.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1A:
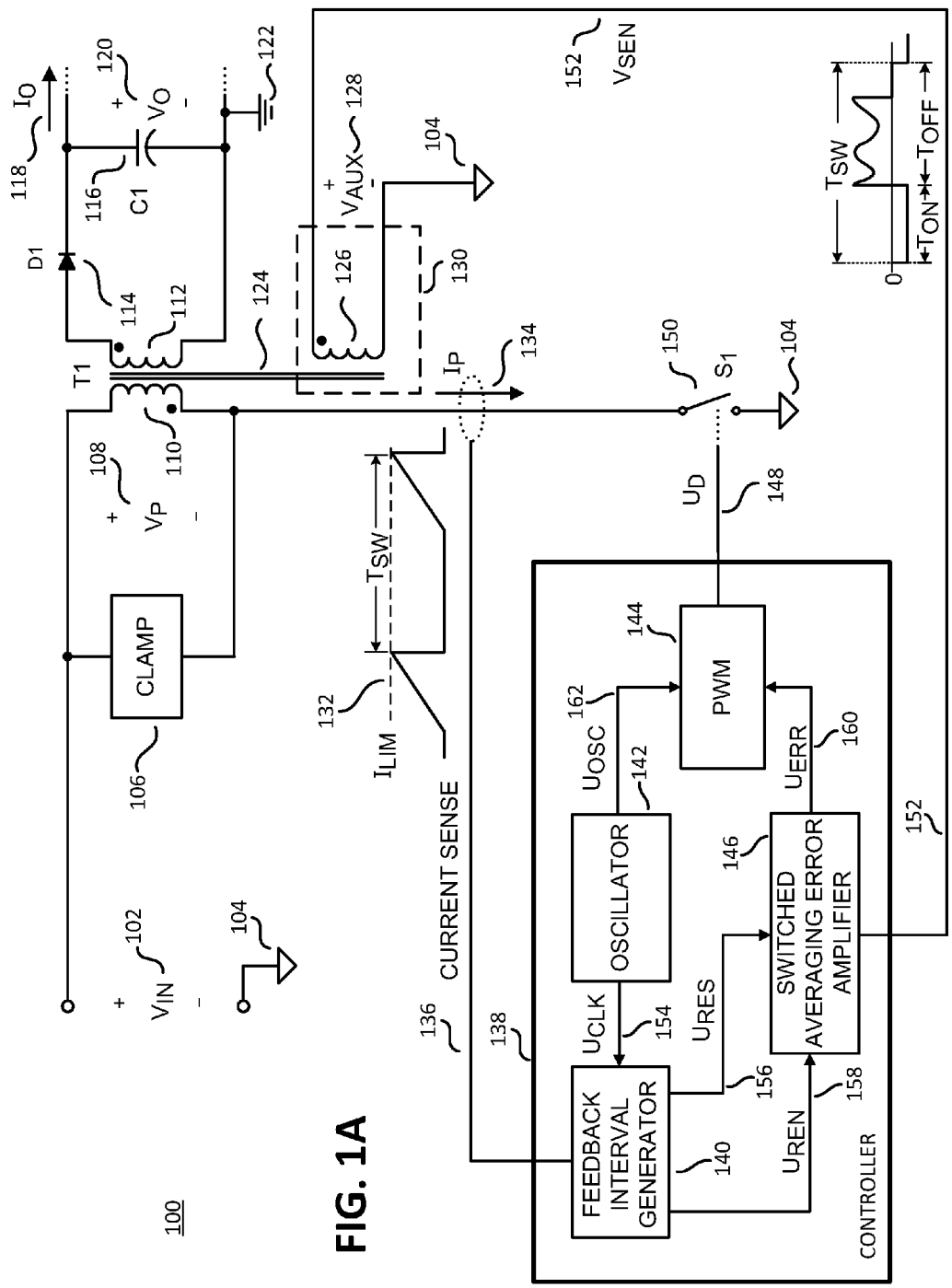
FIG. 1A is a schematic diagram illustrating an example power supply with a controller including one example of a switched averaging error amplifier in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As previously mentioned, the accuracy of the feedback signal is a practical consideration for the controller. Controllers usually take a sample of a monitored quantity (for example voltage or current) that is representative of the output of the power supply to generate the feedback signal. This monitored quantity typically consists of two components: a constant component and a time-varying component. The constant component is the part that is representative of the average output whereas the time-varying component is the part that is representative of the noise and ripple generated due to switching activity and component losses. In certain controller configurations, the controller may need to sample the monitored quantity during a portion of the switching period (generally the off-time of the switch). However, depending on when the sample is taken, the monitored quantity (and hence, the sampled voltage or current) may deviate significantly from the value that represents the output, making the feedback signal less accurate. Output regulation that is achieved with such a controller may not be adequate.

As mentioned above, in some controllers, taking one sample of the monitored quantity during a portion of the switching period may result in reduced accuracy of the feedback signal because of the deviation introduced by the time varying component of the monitored quantity. This may in turn translate into greater discrepancy in an error signal that represents the difference between the feedback signal and the desired output level of the power supply. One remedy to mitigate the problem may be to produce a control signal that is representative of a weighted combination of a plurality of monitored quantity samples and then use the control signal as the feedback signal. This may reduce the deviation in the feedback signal (and hence, the discrepancy in the error signal) as the deviation in one sample of the monitored quantity can fully or partially offset the deviation in the other sample(s) of the monitored quantity. In addition, a further benefit may be realized by producing the control signal in a way that does not require numerical computation and digital processing to obtain a weighted combination of a plurality of monitored quantity samples.

According to the teachings of the present invention, an apparatus and method for generating an error signal that is representative of a difference between a reference signal and a weighted combination of a plurality of input signal samples during a time period is disclosed. In one example, a controller of a power supply includes a switched averaging error amplifier that receives the monitored quantity of the power supply as an input signal and in response generates the error signal during an active period of a read enable signal. More specifically, the monitored quantity can represent the output voltage of the power supply, the output current of the power supply, or a combination of the two and the error signal represents the difference between the reference signal and the weighted combination of a plurality of monitored quantity samples during the active period in accordance with the teachings of the present invention.

FIG. 1A illustrates an example power supply 100, also referred to as a power converter, with a controller 138 that includes a switched averaging error amplifier 146 in accordance with the teachings of the present invention. In the illustrated example, power supply 100 receives a dc input voltage $V_{IN}$ 102 to produce a dc output voltage $V_O$ 120 and a dc output current $I_O$ 118 to a load (not shown in FIG. 1A). In one example, input voltage $V_{IN}$ 102 is a rectified and filtered ac voltage. Input voltage $V_{IN}$ 102 is positive with respect to a primary ground 104 (also referred to as an input return) and output voltage $V_O$ 120 is positive with respect to a secondary ground 122 (also referred to as an output return). In other examples, power supply 100 may have more than one output.

Power supply 100 of FIG. 1A includes an energy transfer element $T_1$ 124 and a switch $S_1$ 150. Switch $S_1$ 150 represents the operation of a controlled semiconductor device such as for example a metal oxide semiconductor field effect transistor (MOSFET) or for example a bipolar junction transistor (BJT). As shown, power supply 100 also includes a controller 138 that receives a current sense signal 136 and a voltage sense signal $V_{SEN}$ 152. As further illustrated in FIG. 1A, a voltage sense circuit 130 produces a pulsating voltage $V_{AUX}$ 128 that may be positive and negative with respect to input return 104.

In the illustrated example, energy transfer element $T_1$ 124 is a coupled inductor, sometimes referred to as a transformer, with three windings and provides galvanic isolation between the input and the output of power supply 100. Galvanic isolation prevents dc current between the input and the output of the power supply. In other words, a dc voltage applied between an input terminal and an output terminal of power supply 100 will produce substantially no dc current between the input terminal and the output terminal of power supply 100. Winding 110 is a primary winding that has one end coupled to the input voltage $V_{IN}$ 102 and the opposite end coupled to the switch $S_1$ 150. Winding 112 is a secondary winding that has one end coupled to output return 122 and the opposite end coupled to a diode D1 114. Winding 126 is a sense winding, sometimes referred to as a bias winding, with one end coupled to the input return 104. The polarities of the windings, indicated by the dots at one end of each winding (dotted ends have the same polarity), show that power supply 100 is configured to be a flyback power supply.

In operation of example power supply 100, controller 138 produces a drive signal 148 that may open and close switch $S_1$ 150 within repetitive switching periods $T_{SW}$. When switch $S_1$ 150 is closed (also referred to as being ON or being in an ON state), switch $S_1$ 150 may conduct current $I_P$ 134 in the primary winding 110 of energy transfer element 124. When switch $S_1$ 150 is open (also referred to as being OFF or being in an OFF state), switch $S_1$ 150 cannot conduct current. When switch $S_1$ 150 is ON, a voltage $V_P$ 108 across the primary winding 110 of energy transfer element 124 becomes substantially equal to input voltage $V_{IN}$ 102. While switch $S_1$ 150 remains in the ON state, primary current $I_P$ 134 increases linearly until it reaches a current limit $I_{LIM}$ 132 which in one example is a fixed limit. During this time, there is substantially no current in secondary winding 112 and in sense winding 126, and coupled inductor $T_1$ 124 stores energy from primary winding 110.

In the example power supply 100, when primary current $I_P$ 134 reaches current limit $I_{LIM}$ 132, controller 138 opens switch $S_1$ 150. Subsequently, the energy stored from the primary winding 110 while switch $S_1$ 150 was conducting begins to transfer to secondary winding 112. This energy transfer produces pulsating current in secondary winding 112, which is in turn rectified by diode D1 114 and filtered by capacitor C1 116 to produce a substantially constant output voltage $V_O$ 120. A clamp circuit 106 is typically coupled across primary winding 110 to limit the voltage on switch $S_1$ 150 when switch $S_1$ 150 opens.

Closing and opening of switch $S_1$ 150 produces voltage $V_{AUX}$ 128 on sense winding 126 that is related by transformer action to the voltages on primary winding 110 and secondary winding 112. When switch $S_1$ 150 is ON, voltage $V_{AUX}$ 128 is negative with respect to input return 104 with a magnitude that is substantially equal to input voltage $V_{IN}$ 102 scaled by a turns ratio that is the number of turns on winding 126 divided by the number of turns on winding 110 of coupled inductor $T_1$ 124. When switch $S_1$ 150 turns OFF and diode D1 114 is forward biased (conducting current), voltage $V_{AUX}$ 128 becomes positive with respect to output return 104 with a magnitude that is substantially equal to output voltage $V_O$ 120 plus the voltage across diode D1 114, the sum scaled by the turns ratio that is the number of turns on winding 126 divided by the number of turns on winding 112. In some cases, diode D1 114 may stop conducting current and become reverse biased at some point after switch $S_1$ 150 turns OFF, causing voltage $V_{AUX}$ 128 to become substantially equal to zero volts until switch $S_1$ 150 turns ON again.

Controller 138 senses primary current $I_P$ 134 that is also the current in switch $S_1$ 150 as a current sense signal 136. Any known technique to sense current, such as for example receiving the voltage across a resistor conducting the current, or for example receiving a scaled current from a current transformer, or for example receiving the voltage across the on-resistance of a metal oxide semiconductor field-effect transistor (MOSFET) that conducts the current, may be used to sense the primary current $I_P$ 134 and to provide current sense signal 136 to controller 138.

The voltage and current waveforms illustrated in FIG. 1A show that power supply 100 is operating in the discontinuous conduction mode (DCM), which is typical for operation at light loads. A distinguishing characteristic of operation in DCM is that primary current $I_P$ 134 is zero immediately after switch $S_1$ 150 turns ON. At higher loads, the power supply typically operates in the continuous conduction mode (CCM), which is distinguished by a jump in primary current $I_P$ 134 from zero to a finite positive value immediately after switch $S_1$ 150 turns ON, not shown in FIG. 1A.

As discussed above, diode $D_1$ 114 is forward biased and conducts current for a certain time period while switch $S_1$ 150 is in OFF state. It is this time period, which is from hereon referred to as a feedback interval, during which voltage $V_{AUX}$ 128 provides information about output voltage $V_O$ 120. In some cases, the feedback interval may be an entire duration that switch $S_1$ 150 is OFF, also referred to as an off-time. In some other cases, the feedback interval may be a portion of the off-time. As shown in FIG. 1A, controller 138 includes a feedback interval generator 140 that generates a read enable signal $U_{REN}$ 158 representative of the feedback interval in response to current sense signal 136 and a clock signal $U_{CLK}$ 154. In one example, feedback interval generator 140 includes a look-up table implemented in a memory to store the corresponding feedback interval information for different output loads and to retrieve this information in response to current sense signal 136. Specifically, current sense signal 136 provides information about the output load which is then used by feedback interval generator 140 to retrieve the corresponding feedback interval information with which clock signal $U_{CLK}$ 154 is adjusted to generate read enable signal $U_{REN}$ 158. It should also be noted that there are alternative signals in controller 138 such as drive signal $U_D$ 148 that can be used to provide feedback interval generator 140 with information about the output load. In one example, feedback interval generator 140 is coupled to receive clock signal $U_{CLK}$ 154 from an oscillator 142. In one example, clock signal $U_{CLK}$ 154 is a periodic signal with a period equal to the switching period $T_{SW}$ of switch $S_1$ 150.

As also mentioned above, controller 138 also includes switched averaging error amplifier 146 that receives read enable signal $U_{REN}$ 158, reset signal $U_{RES}$ 156, voltage sense signal $V_{SEN}$ 152, and generates an error signal $U_{ERR}$ 160. In one example, switched averaging error amplifier 146 is coupled to receive reset signal $U_{RES}$ 156 from feedback interval generator 140. In another example, switched averaging error amplifier 146 can generate reset signal $U_{RES}$ 156 in response to read enable signal $U_{REN}$ 158, which in one example has an active period corresponding to the feedback interval. In operation, reset signal $U_{RES}$ 156 sets error signal $U_{ERR}$ 160 to a fixed value at the beginning of the active period of read enable signal $U_{REN}$ 158. In one example, error signal $U_{ERR}$ 160 is representative of a difference between a reference signal $V_{REF}$ (not shown in FIG. 1A) and a weighted combination of a plurality of voltage sense signal $V_{SEN}$ 152 samples during the active period of read enable signal $U_{REN}$ 158. Specifically, the weighted combination may correspond to an average value of the plurality of voltage sense signal $V_{SEN}$ 152 samples. In the example of FIG. 1A, the reference signal $V_{REF}$ has a value $V_R$ and is representative of the desired voltage level at the output of power supply 100. Therefore, error signal $U_{ERR}$ 160 may be considered to be an error voltage that indicates how much the sensed output differs from the desired value of the output of power supply 100.

Controller 138 of FIG. 1A also includes a pulse width modulator (PWM) 144 that receives error signal $U_{ERR}$ 160 and oscillating signal $U_{OSC}$ 162, and produces drive signal $U_D$ 148 to control the switching of switch $S_1$ 150. In one example, PWM 144 is coupled to receive error signal $U_{ERR}$ 160 from switched averaging error amplifier 146 and oscillating signal $U_{OSC}$ 162 from oscillator 142. In the illustrated example, PWM 144 adjusts drive signal $U_D$ 148 in response to error signal $U_{ERR}$ 160 such that the duration that switch $S_1$ 150 is ON, also referred to as an on-time, is changed to regulate output voltage $V_O$ 120 at a desired value.

Figure 1B:
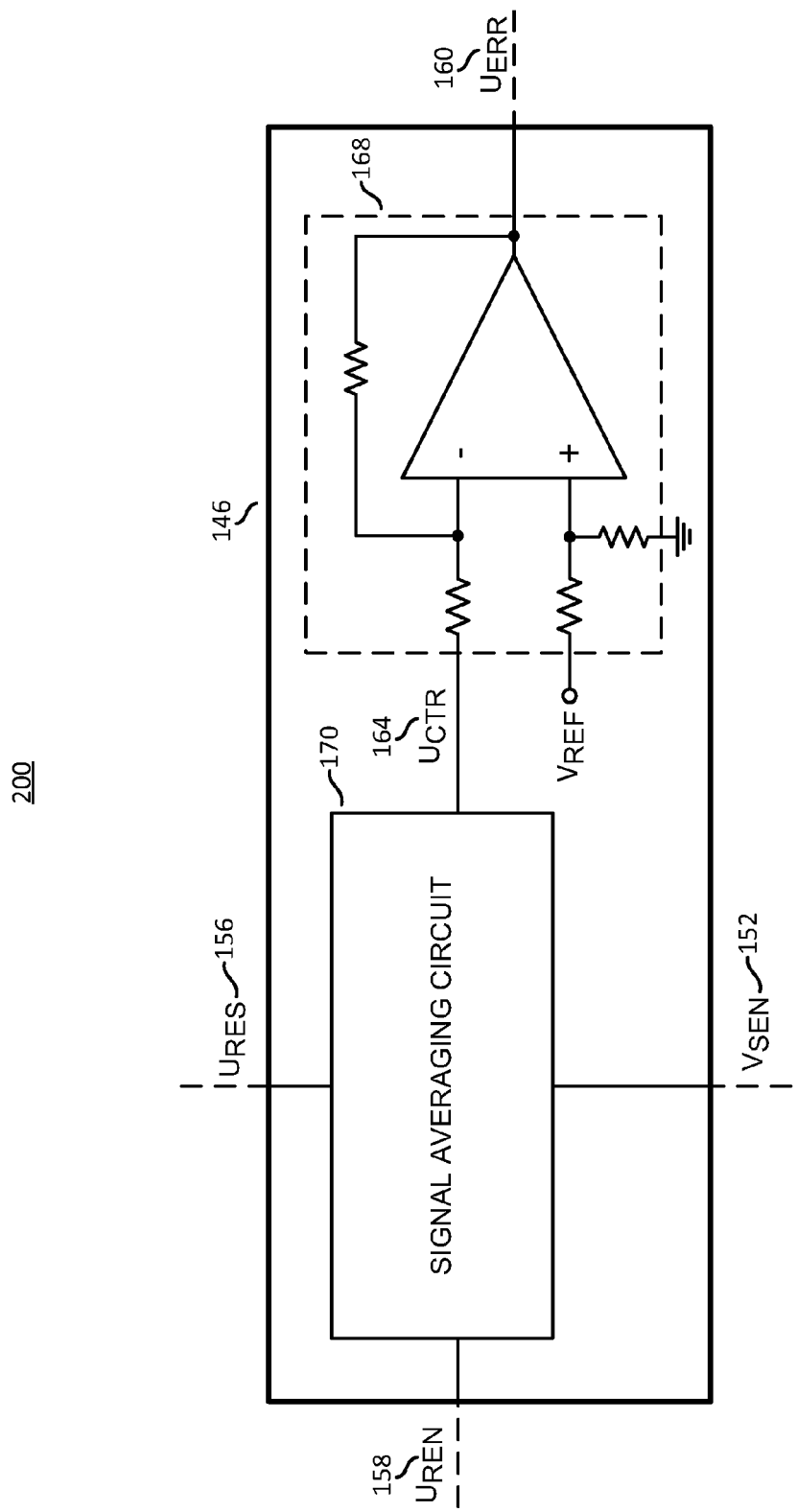
FIG. 1B is a schematic diagram illustrating the example switched averaging error amplifier of the controller in FIG. 1A including one example of a signal averaging circuit in accordance with the teachings of the present invention.

FIG. 1B shows a schematic diagram 200 illustrating the example switched averaging error amplifier 146 of controller 138 of FIG. 1A in accordance with the teachings of the present invention. As shown, switched averaging error amplifier 146 includes signal averaging circuit 170 that receives a read enable signal $U_{REN}$ 158, a reset signal $U_{RES}$ 156 and a voltage sense signal $V_{SEN}$ 152 to output a control signal $U_{CTR}$ 164 representative of a weighted combination of a plurality of voltage sense signal $V_{SEN}$ 152 samples. Further illustrated in FIG. 1B is an error amplifier 168 coupled to signal averaging circuit 170 to receive control signal $U_{CTR}$ 164 and in response, generate an error signal $U_{ERR}$ 160 by subtracting control signal $U_{CTR}$ 164 from the reference signal $V_{REF}$. Therefore, in the illustrated example, error signal $U_{ERR}$ 160 represents the difference between the reference signal $V_{REF}$ and the weighted combination of the plurality of voltage sense signal $V_{SEN}$ 152 samples.

Figure 2A:
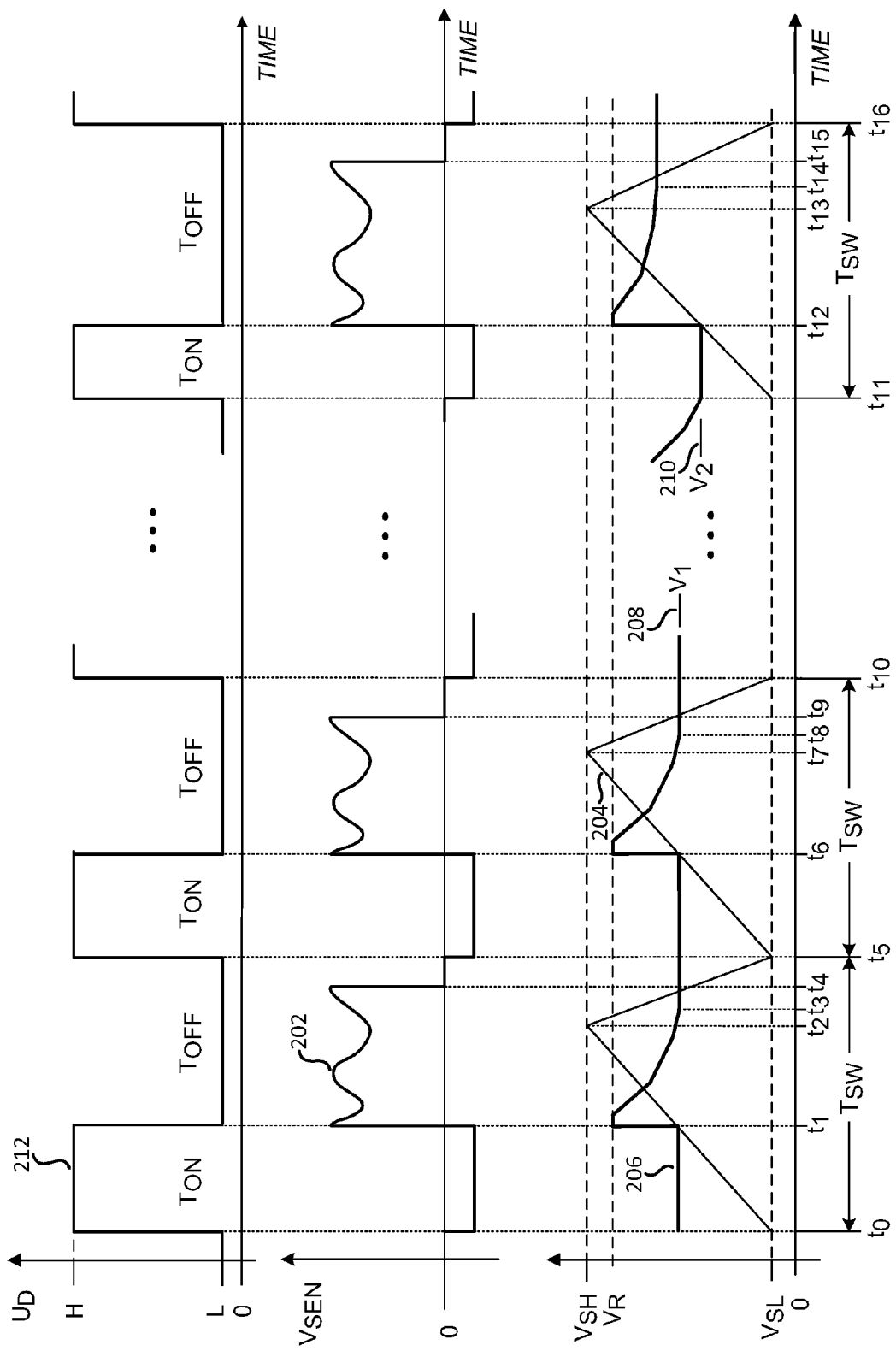
FIG. 2A is a timing diagram showing example waveforms for various signals that are associated with the example controller of the power supply illustrated in FIG. 1A in accordance with the teachings of the present invention.

FIG. 2A shows example waveforms that are associated with the signals at various nodes of controller 138. Waveform 202 is one possible representation of voltage sense signal $V_{SEN}$ 152 received by controller 138. In one example, voltage sense signal $V_{SEN}$ 152 is a substantially constant negative voltage representing input voltage $V_{IN}$ 102 during the on-time of switch $S_1$ 150 such as between time $t_0$ and time $t_1$, between time $t_5$ and $t_6$, etc. and is a voltage of varying magnitude during the off-time of switch $S_1$ 150 such as between time $t_1$ and time $t_5$, between time $t_6$ and time $t_{10}$, etc. More specifically, a portion of voltage sense signal $V_{SEN}$ 152 during the off-time of switch $S_1$ 150 such as between time $t_1$ and time $t_4$, between $t_6$ and time $t_9$, etc. is a non-zero voltage that represents the output of power supply 100 and the remaining portion of voltage sense signal $V_{SEN}$ 152 during the off-time of switch $S_1$ 150 such as between $t_4$ and time $t_5$, between time $t_9$ and time $t_{10}$, etc. is at substantially zero volts and does not provide any information about the output of power supply 100.

Waveform 204 is one possible representation of oscillating signal $U_{OSC}$ 162. As shown, oscillating signal $U_{OSC}$ 162 is illustrated as a periodic triangular waveform that oscillates between a low value $V_{SL}$ and a high value $V_{SH}$ with a period $T_{SW}$. In the illustrated example, the duration that oscillating signal $U_{OSC}$ 162 has a positive slope (where oscillating signal $U_{OSC}$ 162 increases linearly from the low value $V_{SL}$ to the high value $V_{SH}$) is greater than the duration that oscillating signal $U_{OSC}$ 162 has a negative slope (where oscillating signal $U_{OSC}$ 162 decreases linearly from the high value $V_{SH}$ to the low value $V_{SL}$).

Waveform 206 is one possible representation of error signal $U_{ERR}$ 160 generated by switched averaging error amplifier 146. Waveform 212 is one possible representation of drive signal $U_D$ 148 generated by PWM 144. As shown, drive signal $U_D$ is a periodic rectangular waveform that alternates between a low level L and high level H with a period $T_{SW}$. In one example, when drive signal $U_D$ 148 is at high level H, switch $S_1$ 150 is ON and conversely, when drive signal $U_D$ 148 is at low level L, switch $S_1$ 150 is OFF. As a consequence, the longer drive signal $U_D$ 148 remains at high level H, the longer switch $S_1$ 150 remains ON and similarly, the shorter drive signal $U_D$ 148 remains at high level H, the shorter switch $S_1$ 150 remains ON. It is in this manner that PWM 144 controls the switching of switch $S_1$ 150. More particularly, PWM 144 receives error signal $U_{ERR}$ 160 (206) and oscillating signal $U_{OSC}$ 162 (204) and in turn, adjusts within each switching period $T_{SW}$ the duration that drive signal $U_D$ 148 (212) is at high level H by comparing error signal $U_{ERR}$ 160 (206) with oscillating signal $U_{OSC}$ 162 (204). For example, PWM 144 can set drive signal $U_D$ 148 (212) to high level H if error signal $U_{ERR}$ 160 (206) is greater than oscillating signal $U_{OSC}$ 162 (204) and to low level L if error signal $U_{ERR}$ 160 (206) is equal to or less than the oscillating signal $U_{OSC}$ 162 (204). In one embodiment, PWM 144 can set drive signal $U_D$ 148 (212) to high level H only while oscillating signal $U_{OSC}$ 160 (206) is ramping up and sets drive signal $U_D$ to low level L while oscillating signal $U_{OSC}$ 162 (204) is ramping down. Specifically, in the example switched averaging error amplifier 146, drive signal $U_D$ 148 (212) is set to high level H at the beginning of every switching period $T_{SW}$ and latched to low level L when the oscillating signal $U_{OSC}$ 162 (204) becomes greater than or equal to error signal $U_{ERR}$ 160 (206).

As further illustrated in FIG. 2A, when error signal $U_{ERR}$ 160 (206) becomes equal to the oscillating signal $U_{OSC}$ 162 (204) within each switching period $T_{SW}$ such as at time $t_1$, time $t_6$, time $t_{12}$, etc. PWM 144 transitions drive signal $U_D$ 148 (212) from high level H to low level L, causing switch $S_1$ 150 to turn OFF. This transition marks the beginning of the feedback interval where error signal $U_{ERR}$ 160 (206) is set to the value $V_R$. During the feedback interval, error signal $U_{ERR}$ 160 (206) decreases from the value $V_R$ and at a certain point such as time $t_3$, time $t_8$, time $t_{14}$, etc. reaches a final value that is representative of the weighted combination of a plurality of voltage sense signal $V_{SEN}$ 152 samples. Once the final value is reached, error signal $U_{ERR}$ 160 (206) remains substantially constant until the next feedback interval. The final value of error signal $U_{ERR}$ 160 (206) may vary over time depending on voltage sense signal $V_{SEN}$ 152. For example, as shown in FIG. 2A, error signal $U_{ERR}$ 160 (206) reaches a final value of $V_1$ 208 in the first two switching periods. However, after several switching periods the final value of error signal $U_{ERR}$ 160 (206) drops to $V_2$ 210, resulting in the reduction of the on-time of switch $S_1$ 150 in the subsequent switching period $T_{SW}$.

Figure 2B:
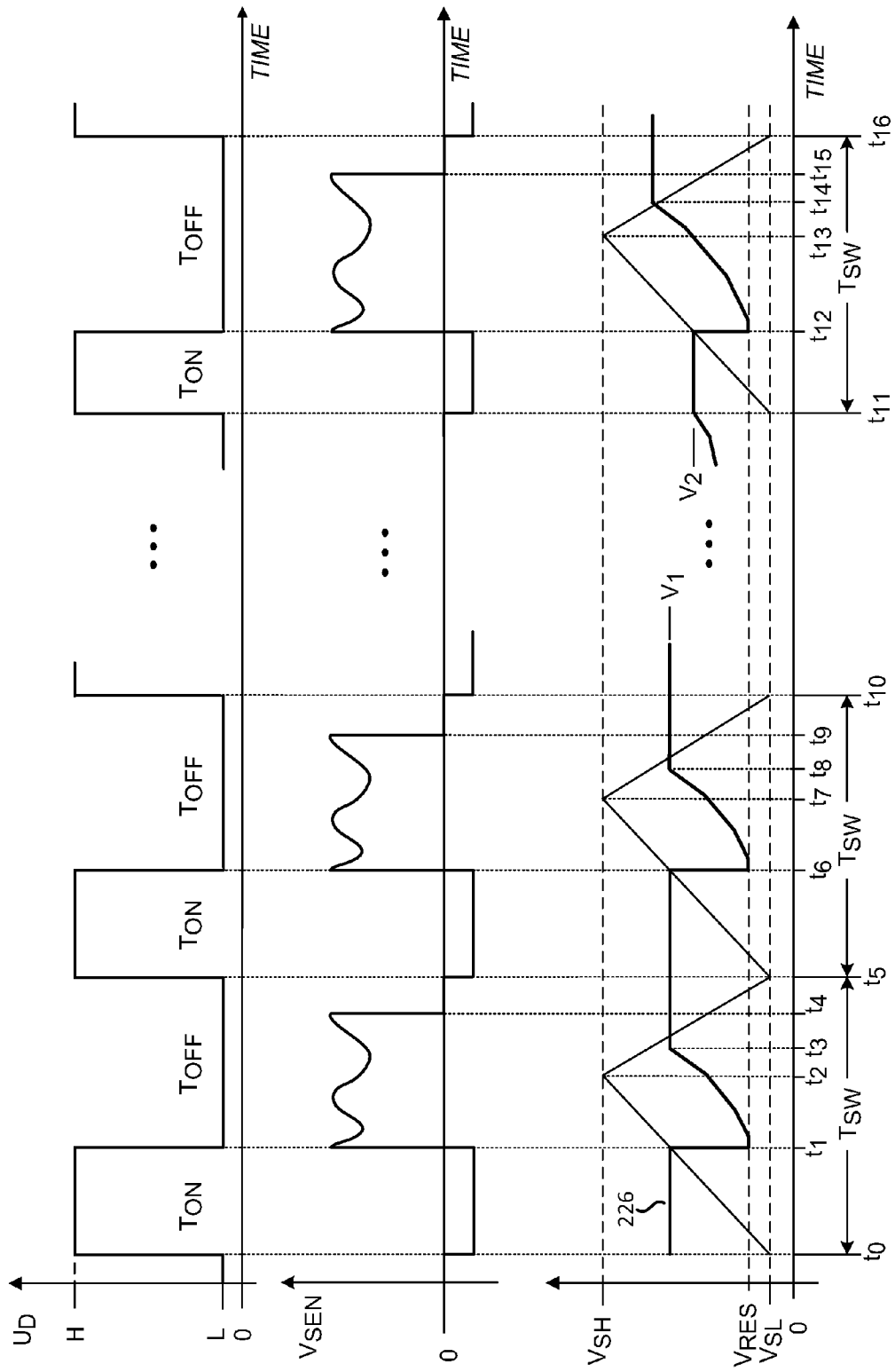
FIG. 2B is a timing diagram showing example waveforms for various signals that are associated with a differently configured example controller of the power supply illustrated in FIG. 1A in accordance with the teachings of the present invention.

FIG. 2B shows example waveforms for various signals that are associated with the controller 138 of the power supply of FIG. 1A that is configured differently from the controller illustrated in FIG. 2A. In one example, it is switched averaging error amplifier 146 of controller 138 that is configured differently. These waveforms share many similarities with the waveforms of FIG. 2A with the exception being the direction and the rate at which error signal $U_{ERR}$ 160 (226) varies during corresponding feedback intervals. More specifically, error signal $U_{ERR}$ 160 (206) as represented by waveform 206 of FIG. 2A decreases from the value $V_R$ with a decreasing slope (rate of change over time is decreasing) during each feedback interval whereas error signal $U_{ERR}$ 160 (226) as represented by waveform 226 of FIG. 2B, which is one possible representation of error signal $U_{ERR}$ 160 of controller 138 that is configured differently from the controller illustrated in FIG. 2A, increases from a reset voltage $V_{RES}$ with an increasing slope (rate of change over time is increasing) during each feedback interval.

Figure 3:
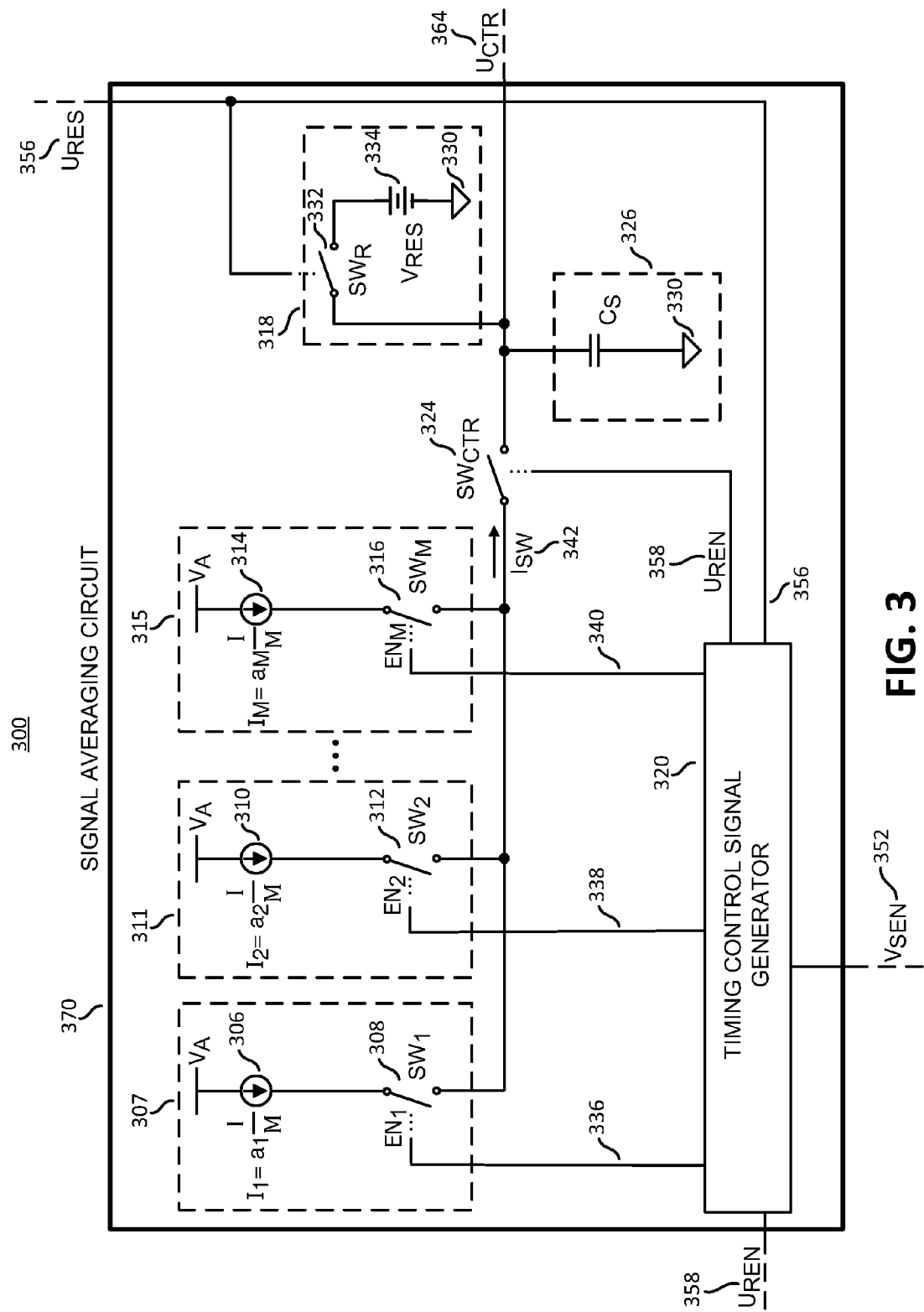
FIG. 3 is a schematic diagram illustrating the example signal averaging circuit of FIG. 1B in accordance with the teachings of the present invention.

FIG. 3 shows a circuit diagram 300 illustrating the example signal averaging circuit 370 of switched averaging error amplifier 146 of FIG. 1A. The illustrated signal averaging circuit 370 includes a timing control signal generator 320 that receives read enable signal $U_{REN}$ 358, reset signal $U_{RES}$ 356 and voltage sense signal $V_{SEN}$ 352, and in response, generates M enable signals $EN_1$ 336, $EN_2$ 338 to $EN_M$ 340 where integer M denotes the number of voltage sense signal $V_{SEN}$ 352 samples to be represented by a control signal $U_{CTR}$ 364 and can be any positive integer greater than 1. In one example, read enable signal $U_{REN}$ 358 and reset signal $U_{RES}$ 356 are signals with logic low and logic high levels. The portion of read enable signal $U_{REN}$ 358 that is logic high is from hereon referred to as an active period of read enable signal $T_{ACT}$. Voltage sense signal $V_{SEN}$ 352 is, in one example, an analog signal and more specifically, a voltage signal whose magnitude can vary during the active period of read enable signal $T_{ACT}$.

Signal averaging circuit 370 further includes a plurality of switched weighted current sources (307, 311 and 315) to generate a total amount of charge that represents a weighted sum of a plurality of voltage sense signal $V_{SEN}$ 352 samples during active period of read enable signal $T_{ACT}$. In one example, the plurality of switched weighted current sources (307, 311 and 315) comprises a plurality of current sources (306, 310 and 314) coupled together by way of switches $SW_1$ 308, $SW_2$ 312 and $SW_M$ 316 to adjust the total amount of charge in response to enable signals $EN_1$ 336, $EN_2$ 338 to $EN_M$ 340, which in one example are representative of the plurality of voltage sense signal $V_{SEN}$ 352 samples during the active period of read enable signal $U_{REN}$ 358, received from timing control signal generator 320. In the illustrated example, the duration that each one of the plurality of current sources (306, 310 and 314) is enabled/disabled is controlled by the respective enable signal. For example, enable signal $EN_1$ 336 may be coupled to enable/disable a current source 306 to provide a current of value $I_1$ for a certain time period whereas enable signal $EN_2$ 338 may be coupled to enable/disable a current source 310 to provide a current of value $I_2$ for some other time period. In one example, enable signals $EN_1$ 336, $EN_2$ 338 to $EN_M$ 340 have logic low and logic high levels, and logic high level for any of the enable signals corresponds to a closed (enabled) switch and hence, an enabled current source. As further shown, the value of current that each one of the plurality of current sources (306, 310 and 314) provides is weighted differently. For example, current source 306 provides a current of value $I_1$ which is $a_1$ times the current of value I/M whereas current source 310 provides a current of value $I_2$ which is $a_2$ times the current of value I/M.

FIG. 3 further illustrates a storage circuit 326 coupled to the plurality of switched weighted current sources (307, 311 and 315) to generate control signal $U_{CTR}$ 364. In one example, storage circuit 326 generates control signal $U_{CTR}$ 364 by converting the total amount of charge into a voltage representative of control signal $U_{CTR}$ 364. In one embodiment, storage circuit 326 includes a storage capacitor $C_S$ coupled to a ground terminal 330. In the illustrated example, a control switch $SW_{CTR}$ 324 is shown to be coupled between storage circuit 326 and the plurality of switched weighted current sources (307, 311 and 315) to control current conduction in response to read enable signal $U_{REN}$ 358. More specifically, control switch $SW_{CTR}$ 324 may allow current conduction between storage circuit 326 and the plurality of switched weighted current sources (307, 311 and 315) when read enable signal $U_{REN}$ 358 is logic high and may block current conduction between storage circuit 326 and the plurality of switched weighted current sources (307, 311 and 315) when read enable signal $U_{REN}$ 358 is logic low. In the example signal averaging circuit 370, storage circuit 326 is charged upon receiving a control switch current $I_{SW}$ 342, which is the current in control switch $SW_{CTR}$ 324, from the plurality of switched weighted current sources (307, 311 and 315) when control switch $SW_{CTR}$ 324 allows current conduction. In an alternative embodiment, storage circuit 326 can be set to a high voltage at the beginning of the active period of read enable signal $U_{REN}$ 358 and the plurality of switched weighted current sources (307, 311 and 315) can be configured to discharge storage circuit 326 by removing control switch current $I_{SW}$ 342 from storage circuit 326 when control switch $SW_{CTR}$ 324 allows current conduction.

As further shown in FIG. 3, signal averaging circuit 370 also includes a reset circuit 318 coupled to storage circuit 326 to set control signal $U_{CTR}$ 364 to reset voltage $V_{RES}$ at the beginning of active period of the read enable signal $U_{REN}$ 358. In one example, reset circuit 318 includes a reset switch $SW_R$ 332 coupled to a voltage source 334 that has a value equal to reset voltage $V_{RES}$. In one example, reset voltage $V_{RES}$ is substantially zero volts. In operation, reset switch $SW_R$ 332 receives reset signal $U_{RES}$ 356 at the beginning of the active period of the read enable signal $U_{REN}$ 358 and in response, couples the voltage source 334 to storage circuit 326. In one example, reset circuit 318 is coupled to receive reset signal $U_{RES}$ 356 from an external source. In another example, reset circuit 318 can be coupled to receive reset signal $U_{RES}$ 356 from a separate block (not shown in FIG. 3) within signal averaging circuit 370.

Figure 4A:
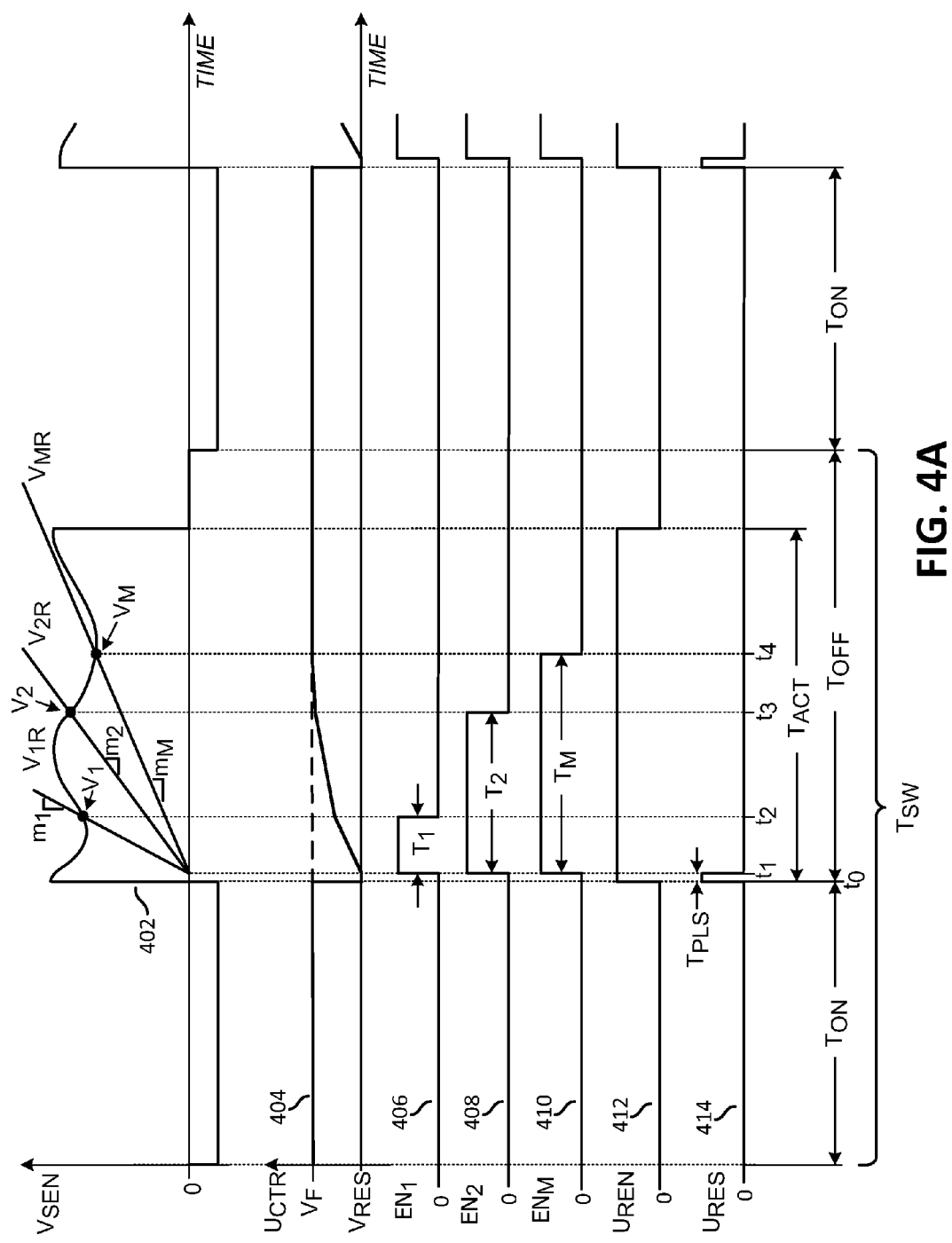
FIG. 4A is a timing diagram showing example waveforms for various signals that are associated with the example signal averaging circuit illustrated in FIG. 3 in accordance with the teachings of the present invention.

FIG. 4A shows example waveforms for various signals that are associated with signal averaging circuit 370 in accordance with the teachings of the present invention. Waveform 402 is one possible representation of voltage sense signal $V_{SEN}$ 352. Waveform 412 is one possible representation of read enable signal $U_{REN}$ 358 received by timing control signal generator 320. In one example, read enable signal $U_{REN}$ 358 (412) is a periodic rectangular waveform with a period $T_{SW}$. Period $T_{SW}$ has one portion, also referred to as an on-time $T_{ON}$, during which read enable signal $U_{REN}$ 358 (412) is logic low and correspondingly, voltage sense signal $V_{SEN}$ 352 (402) is a substantially constant negative voltage. Period $T_{SW}$ has another portion, also referred to as an off-time $T_{OFF}$, during which read enable signal $U_{REN}$ 358 (412) can become logic high. Stated differently, active period of read enable signal $T_{ACT}$ can only be within off-time $T_{OFF}$. In one example, active period of read enable signal $T_{ACT}$ can be a portion of off-time $T_{OFF}$ or can be equal to the entire off-time $T_{OFF}$. In the illustrated example, voltage sense signal $V_{SEN}$ 352 (402) is a voltage with varying magnitude during the active period of read enable signal $T_{ACT}$ and is a substantially constant voltage of zero volts during the remaining portion of off-time $T_{OFF}$.

As further shown in FIG. 4A, waveform 414, which is one possible representation of reset signal $U_{RES}$ 356, is a pulse that becomes logic high for a duration $T_{PLS}$ at the beginning of active period $T_{ACT}$ of read enable signal $U_{REN}$ 358 (412). Reset signal $U_{RES}$ 356 (414) from hereon will also be referred to as a reset pulse. Waveforms 406, 408, 410 are one possible representation of enable signals $EN_1$ 336, $EN_2$ 338 to $EN_M$ 340 respectively. In one example, the duration that each one of enable signals $EN_1$ 336 (406), $EN_2$ 338 (408) to $EN_M$ 340 (410) is logic high represents the time interval between the falling edge of the reset pulse and a corresponding one of the plurality of voltage sense signal $V_{SEN}$ 352 (402) samples. For example, enable signal $EN_1$ 336 (406) is logic high for a time period $T_1$, which represents the time interval between the falling edge of the reset pulse and a voltage sense signal $V_{SEN}$ 352 (402) sample $V_1$, enable signal $EN_2$ 338 (408) is logic high for a time period $T_2$ which represents the time interval between the falling edge of the reset pulse and a voltage sense signal $V_{SEN}$ 352 (402) sample $V_2$, etc. Waveform 404 is one possible representation of control signal $U_{CTR}$ 364.

Operation of signal averaging circuit 370 is now explained with reference to FIG. 3 and FIG. 4A. As described above, read enable signal $U_{REN}$ 358 (412) is logic low during on-time $T_{ON}$ and as such, switch $SW_{CTR}$ 324 blocks current conduction between plurality of switched weighted current sources (307, 311 and 315) and storage circuit 326, allowing control signal $U_{CTR}$ 364 (404) to remain at a substantially constant positive voltage until off-time $T_{OFF}$. Waveforms 412 and 414 further illustrate that both read enable signal $U_{REN}$ 358 and reset signal $U_{RES}$ 356 transition from logic low to logic high at time $t_0$. Transition of reset signal $U_{RES}$ 356 (414) from logic low to logic high couples reset circuit 318 to storage circuit 326 and sets control signal $U_{CTR}$ 364 (404) to reset voltage $V_{RES}$. Additionally, when reset signal $U_{RES}$ 356 (414) is logic high, timing control signal generator 320 sets each one of enable signals $EN_1$ 336 (406), $EN_2$ 338 (408) to $EN_M$ 340 (410) to logic low, thereby disabling each one of the plurality of current sources (306, 310 and 314). As further shown in FIG. 4A, reset signal $U_{RES}$ 356 (414) stays at logic high for the duration $T_{PLS}$ and transitions back to logic low at time $t_1$. Accordingly, control signal $U_{CTR}$ 364 (404) stays at reset voltage $V_{RES}$ until time $t_1$ which is when each one of enable signals $EN_1$ 336 (406), $EN_2$ 338 (408) to $EN_M$ 340 (410) becomes logic high and enables the corresponding one of the plurality of current sources (306, 310 and 314). As such, after time $t_1$ storage circuit 326 begins to charge by receiving current from the plurality of switched weighted current sources (307, 311 and 315) and in turn, control signal $U_{CTR}$ 364 (404) begins to increase.

In the illustrated example, timing control signal generator 320 transitions enable signals $EN_1$ 336 (406), $EN_2$ 338 (408) to $EN_M$ 340 (410) from logic high to logic low sequentially, thereby disabling respective current sources sequentially as well. For example, current source 306 is associated with enable signal $EN_1$ 336 (406) and is disabled at time $t_2$ (hence, storage circuit 326 receives current from current source 306 for time period $T_1$), current source 310 is associated with enable signal $EN_2$ 338 (408) and is disabled later at time $t_3$ (hence, storage circuit 326 receives current from current source 310 longer for time period $T_2$), and so on. Therefore, the rate at which control signal $U_{CTR}$ 364 (404) increases varies during active period of read enable signal $T_{ACT}$. More specifically, the rate of change of control signal $U_{CTR}$ 364 (404) decreases as each one of the plurality of current sources (306, 310 and 314) is sequentially disabled. For example, between time $t_1$ and time $t_2$ all current sources are enabled to charge storage circuit 326 and accordingly, control signal $U_{CTR}$ 364 (404) increases at the highest rate but between time $t_2$ and $t_3$ current source 306 is disabled and consequently, control signal $U_{CTR}$ 364 (404) increases at a lower rate during this time period. It is further illustrated that control signal $U_{CTR}$ 364 (404) continues to increase until current source 314 is disabled at time $t_4$ which also is when control signal $U_{CTR}$ 364 (404) reaches a final value $V_F$. From time $t_4$ until the beginning of active period of read enable signal $T_{ACT}$ of next period $T_{SW}$, control signal $U_{CTR}$ 364 (404) remains substantially constant at the final value $V_F$ because all current sources are disabled and there is no current conduction between the plurality of switched weighted current sources (307, 311 and 315) and storage circuit 326. In one example, the final value $V_F$ is equal to the total amount of charge that each one of the plurality of current sources (306, 310 and 314) provides to storage circuit 326 while corresponding one of enable signals $EN_1$ 336 (406), $EN_2$ 338 (408) to $EN_M$ 340 (410) is logic high during active period of read enable signal $T_{ACT}$, divided by a capacitance of storage circuit 326, and can be expressed with the following equation:

$$V_F = \frac{1}{C}(I_1 T_1 + I_2 T_2 + \ldots + I_M T_M) \quad (1)$$

where C is the capacitance of storage circuit 326. Substituting actual current values for currents $I_1$, $I_2$ to $I_M$, equation (1) can be rewritten as $$V_F = \frac{I}{MC}(a_1 T_1 + a_2 T_2 + \ldots + a_M T_M) \quad (2)$$

In the illustrated example, timing control signal generator 320 generates M ramp signals $V_{1R}$, $V_{2R}$ to $V_{MR}$, which start to ramp from zero volts at time $t_1$ with respective slopes $m_1$, $m_2$ to $m_M$, to set the time period between the falling edge of the reset pulse and each one of the plurality of voltage sense signal $V_{SEN}$ 352 (402) samples. For example, ramp signal $V_{1R}$ is used to set time period $T_1$ between the falling edge of the reset pulse and voltage sense signal $V_{SEN}$ 352 (402) sample $V_1$. Similarly, ramp signal $V_{2R}$ is used to set time period $T_2$ between the falling edge of the reset pulse and voltage sense signal $V_{SEN}$ 352 (402) sample $V_2$. Therefore, time periods $T_1$, $T_2$ and $T_M$ can be expressed mathematically as the ratio of corresponding voltage sense signal $V_{SEN}$ 352 (402) sample to the slope of respective ramp signal. For example, $T_1$ equals input signal sample $V_1$ divided by slope $m_1$ of ramp signal $V_{1R}$ (i.e., $V_1/M_1$), $T_2$ equals input signal sample $V_2$ divided by slope $m_2$ of ramp signal $V_{2R}$ (i.e., $V_2/m_2$), and so on. Using this information, equation (2) can be rewritten as follows:

$$V_F = \frac{I}{MC}\left(a_1 \frac{V_1}{m_1} + a_2 \frac{V_2}{m_2} + \ldots + a_M \frac{V_M}{m_M}\right) \quad (3)$$

As seen in equation (3), the final value $V_F$ is representative of a weighted combination of the plurality of voltage sense signal $V_{SEN}$ 352 (402) samples during active period of read enable signal $T_{ACT}$. Having different values for coefficients $a_1$, $a_2$ to $a_M$ and for slopes $m_1$, $m_2$ to $m_M$ may produce a different weighting factor for each one of the plurality of voltage sense signal $V_{SEN}$ 352 (402) samples and hence, may result in a different sum. In one example, coefficients $a_1$, $a_2$ to $a_M$ and slopes $m_1$, $m_2$ to $m_M$ can be chosen in a specific manner such that the final value $V_F$ represents a scaled average value of the plurality of voltage sense signal $V_{SEN}$ 352 (402) samples. Specifically, when the weighting factor for each one the plurality of voltage sense signal $V_{SEN}$ 352 (402) samples such as $a_1/m_1$, $a_2/m_2$, etc. is chosen identical, the final value $V_F$ represents the average value of the plurality of voltage sense signal $V_{SEN}$ 352 (402) samples scaled by the value of the weighting factor. In other words, signal averaging circuit 370 produces a weighted average value by summing the weighted voltage sense signal $V_{SEN}$ 352 (402) samples as opposed to scaling the sum of voltage sense signal $V_{SEN}$ 352 (402) samples.

Figure 4B:
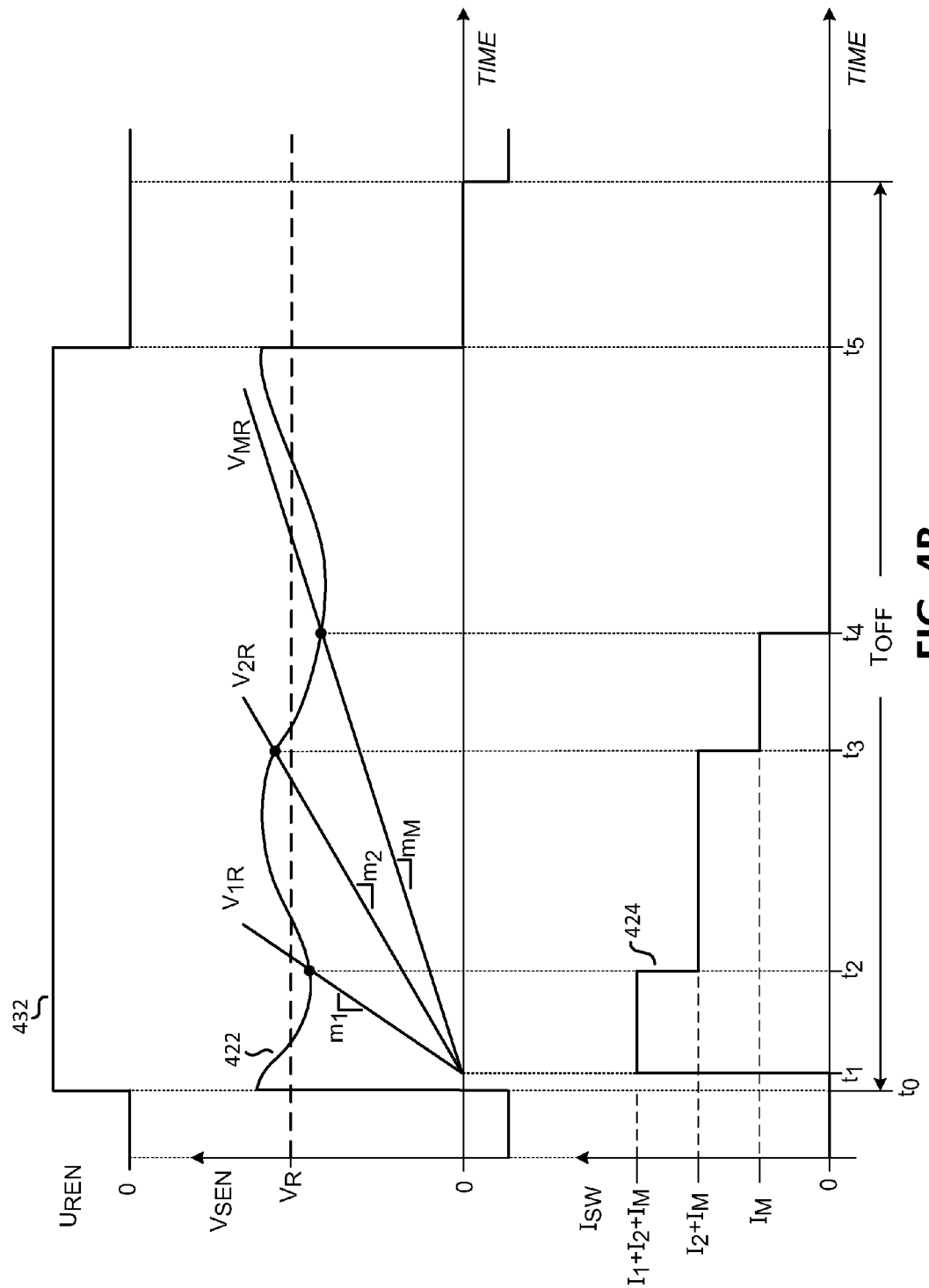
FIG. 4B is a diagram showing expanded views of various example waveforms illustrated in FIG. 4A in accordance with the teachings of the present invention.

FIG. 4B shows expanded views of various example waveforms illustrated in FIG. 4A in accordance with the teachings of the present invention. More particularly, waveform 422 is one possible representation of voltage sense signal $V_{SEN}$ 352 during off-time $T_{OFF}$, waveform 424 is one possible representation of a control switch current $I_{SW}$ 342 during off-time $T_{OFF}$ and waveform 432 is one possible representation of read enable signal $U_{REN}$ 358 during off-time $T_{OFF}$. As previously mentioned, when read enable signal $U_{REN}$ 358 (432) is logic high and reset signal $U_{RES}$ 356 (414) transitions from logic high to logic low at time $t_1$, ramp signals $V_{1R}$, $V_{2R}$ to $V_{MR}$ start to ramp from zero volts with respective slopes of $m_1$, $m_2$ to $m_M$. Each one of ramp signals $V_{1R}$, $V_{2R}$ to $V_{MR}$ is associated with one of enable signals $EN_1$ 336, $EN_2$ 338 to $EN_M$ 340 and in turn, controls the duration that the corresponding one of the plurality of current sources (306, 310 and 314) is enabled during active period of read enable signal $T_{ACT}$. In the example signal averaging circuit 370, this is accomplished by comparing each one of ramp signals $V_{1R}$, $V_{2R}$ to $V_{MR}$ with voltage sense signal $V_{SEN}$ 352 (422) such that when one of ramp signals $V_{1R}$, $V_{2R}$ to $V_{MR}$ is less than voltage sense signal $V_{SEN}$ 352 (422) corresponding one of the plurality of current sources (306, 310 and 314) is enabled and when one of ramp signals $V_{1R}$, $V_{2R}$ to $V_{MR}$ becomes equal to or greater than voltage sense signal $V_{SEN}$ 352 (422) corresponding one of the plurality of current sources (306, 310 and 314) is disabled. As an example, ramp signal $V_{1R}$ is associated with enable signal $EN_1$ 336 (and hence, with current source 306) and controls the duration that current source 306 is enabled during active period of read enable signal $T_{ACT}$ such that when ramp signal $V_{1R}$ is less than voltage sense signal $V_{SEN}$ 352 (422) current source 306 is enabled and when $V_{1R}$ becomes equal to or greater than voltage sense signal $V_{SEN}$ 352 (422) current source 306 is disabled.

As further shown in FIG. 4B, slopes $m_1$, $m_2$ to $m_M$ are different from each other. That is, slope $m_1$ of ramp signal $V_{1R}$ is greater than slope $m_2$ of ramp signal $V_{2R}$ and slope $m_2$ of ramp signal $V_{2R}$ is greater than slope $m_M$ of ramp signal $V_{MR}$. Therefore, each one of the plurality of current sources (306, 310 and 314) is disabled sequentially, causing control switch current $I_{SW}$ 342 (424) to decrease in stepwise fashion since control switch current $I_{SW}$ 342 (424) is the sum of currents provided by each one of the plurality of current sources (306, 310 and 314). To illustrate, between time $t_1$ and time $t_2$, all of the plurality of current sources (306, 310 and 314) are enabled and control switch current $I_{SW}$ 342 is equal to the sum of currents $I_1$, $I_2$ and $I_M$ provided by current sources 306, 310, 314. At time $t_2$, ramp signal $V_{1R}$ becomes equal to voltage sense signal $V_{SEN}$ 352 (422) and the corresponding current source 306 is disabled. As such, control switch current $I_{SW}$ 342 (424) is equal to the sum of current $I_2$ and current $I_M$ between time $t_2$ and time $t_3$.

Furthermore, at time $t_3$, ramp signal $V_{2R}$ becomes equal to voltage sense signal $V_{SEN}$ 352 (422) and the corresponding current source 310 is disabled, making control switch current $I_{SW}$ 342 equal to $I_M$ between time $t_3$ and time $t_4$. At time $t_4$, ramp signal $V_{MR}$ becomes equal to voltage sense signal $V_{SEN}$ 352 (422) and the corresponding current source 314 is disabled. From thereon (time $t_4$) until read enable signal $U_{REN}$ 358 (432) transitions to logic low level at time $t_5$ (end of active period of read enable signal $T_{ACT}$), there is no current source available to provide current and control switch current $I_{SW}$ 342 becomes substantially zero. From time $t_5$ until the end of off-time $T_{OFF}$, read enable signal $U_{REN}$ 358 (432) is logic low and control switch $SW_{CTR}$ 324 is disabled. Therefore, control switch current $I_{SW}$ 342 (424) remains at substantially zero until the beginning of active period of read enable signal $T_{ACT}$ of next period $T_{SW}$. It is in this manner that control current switch $I_{SW}$ 342 (424) is adjusted to charge storage circuit 326 to the final value $V_F$ that is representative of weighted combination of the plurality of voltage sense signal $V_{SEN}$ 352 (422) samples during active period of read enable signal $T_{ACT}$.

Figure 4C:
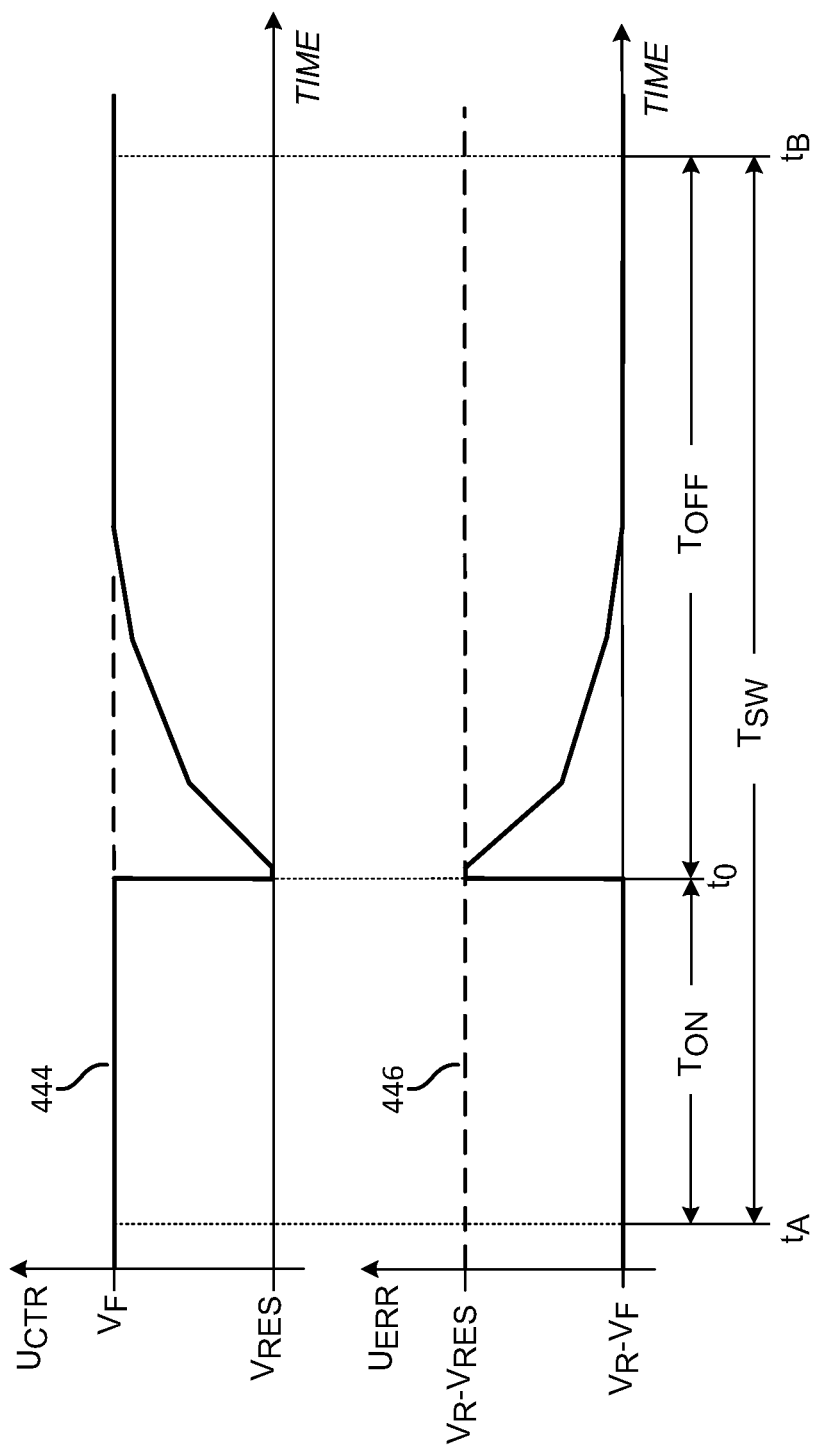
FIG. 4C is a diagram showing expanded views of example waveforms for various signals that are associated with the example switched averaging error amplifier illustrated in FIG. 1B in accordance with the teachings of the present invention.

FIG. 4C shows expanded views of example waveforms for various signals that are associated with switched averaging error amplifier 146 of FIG. 1B including signal averaging circuit 170 in accordance with the teachings of the present invention. Specifically, waveform 444 is one possible representation of control signal $U_{CTR}$ 164 generated by signal averaging circuit 170 during one switching period $T_{SW}$ and waveform 446 is one possible representation of the resulting error signal $U_{ERR}$ 160 during one switching period $T_{SW}$. As previously mentioned, error signal $U_{ERR}$ 160 (446) is generated by subtracting control signal $U_{CTR}$ 164 (444) from the reference signal $V_{REF}$ and thus, represents the difference between the reference signal $V_{REF}$ and control signal $U_{CTR}$ 164 (444). Accordingly, as further illustrated in FIG. 4C, with control signal $U_{CTR}$ 164 (444) staying substantially constant at the final value $V_F$, error signal $U_{ERR}$ 160 (446) stays substantially constant at a value $V_R-V_F$ during the on-time $T_{ON}$ (between time $t_0$ and time $t_B$) and with control signal $U_{CTR}$ 164 (444) increasing from a value equal to the reset voltage $V_{RES}$ to the final value $V_F$ in a piecewise linear fashion, error signal $U_{ERR}$ 160 (446) decreases from a value $V_R-V_{RES}$ to the value $V_R-V_F$ during the off-time $T_{OFF}$ (between time $t_0$ and time $t_B$) in a piecewise linear fashion. In this manner, a switched averaging error amplifier can generate an error signal representative of the difference between a reference signal and a weighted combination of a plurality of input signal samples during a time period.

Figure 5:
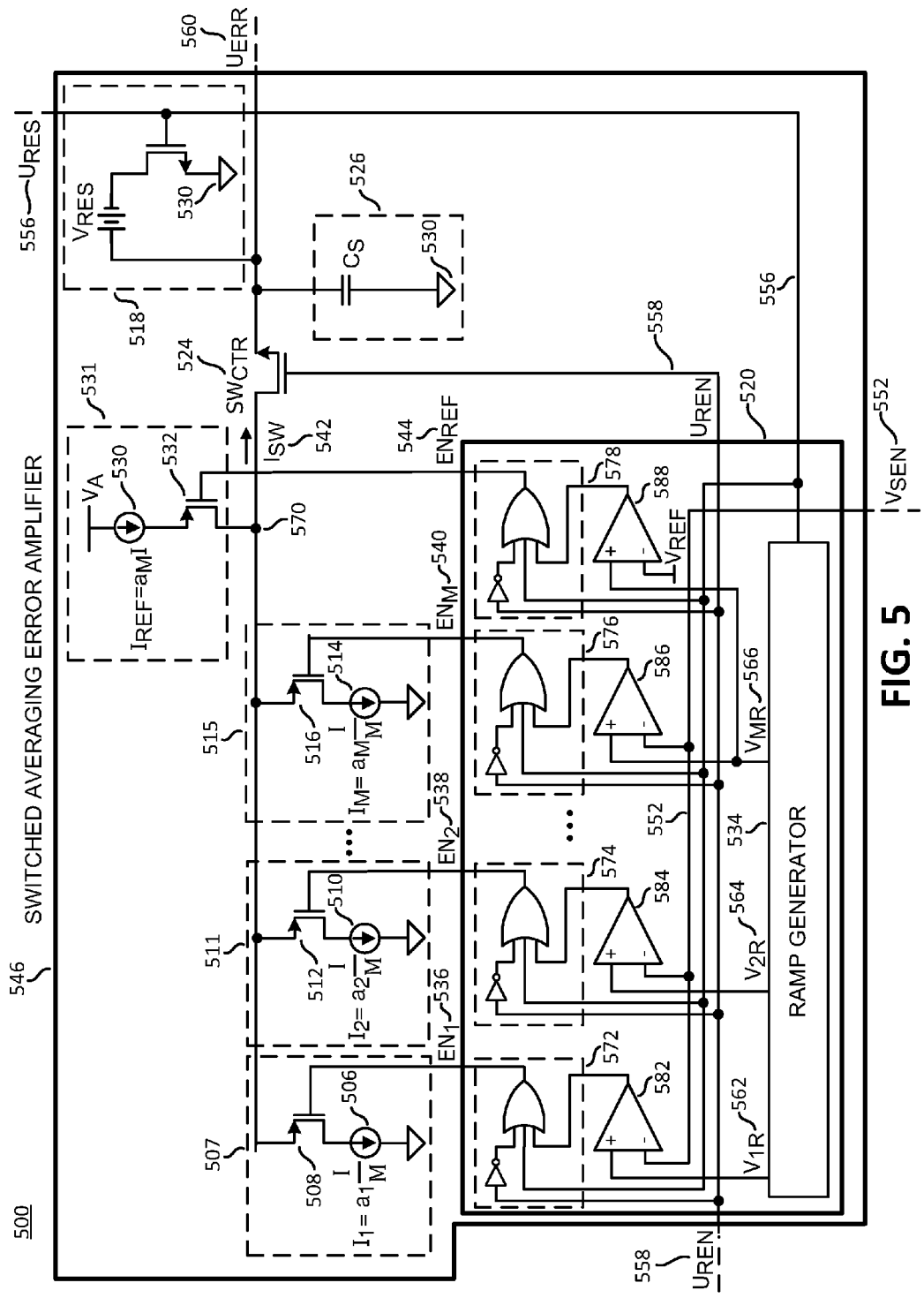
FIG. 5 is a circuit diagram illustrating another example of a switched averaging error amplifier in accordance with the teachings of the present invention.

FIG. 5 shows a circuit diagram 500 illustrating another example of a switched averaging error amplifier 546 that can be used in controller 138 of FIG. 1 in accordance with the teachings of the present invention. Switched averaging error amplifier 546 shares many aspects of switched averaging error amplifier 146 of FIG. 1B. In the illustrated example, switched averaging error amplifier 546 includes a plurality of switched weighted current sources (507, 511, 515) to generate a total amount of charge that represents a weighted sum of a plurality of voltage sense signal $V_{SEN}$ 552 samples during active period of read enable signal $T_{ACT}$. As further shown, the plurality of switched weighted current sources (507, 511, 515) comprises a plurality of current sources (506, 510, 514) coupled together by way of switches 508, 512, 516 to adjust the total amount of charge in response to enable signals $EN_1$ 536, $EN_2$ 538 to $EN_M$ 540, which in one example are representative of the plurality of voltage sense signal $V_{SEN}$ 552 samples during the active period of read enable signal $U_{REN}$ 558, received from a timing control signal generator 520. It is further illustrated in FIG. 5 that switched averaging error amplifier 546 also includes a switched reference current source 531 to generate a reference charge representative of reference signal $V_{REF}$ of value $V_R$. As further shown, switched reference current source 531 comprises a reference current source 530 coupled to the plurality of switched weighted current sources (507, 511, 515) by way of a switch 532 to adjust the total amount of charge in response to an enable signal $EN_{REF}$ 544, which in one example is representative of reference signal $V_{REF}$, such that the total amount of charge represents the difference between the reference charge and the weighted sum of the plurality of voltage sense signal $V_{SEN}$ 552 samples during active period of read enable signal $T_{ACT}$. Also shown in switched averaging error amplifier 546 is storage circuit 526 that receives the total amount of charge and generates an error signal $U_{ERR}$ 560. In one example, storage circuit 526 generates error signal $U_{ERR}$ 560 by converting the total amount of charge into a voltage representative of error signal $U_{ERR}$ 560. Even though switches 508, 512, 516 and 532 are shown to be p-channel MOSFETs in the example switched averaging error amplifier 546, any known semiconductor switch such as for example an n-channel MOSFET, or for example a bipolar junction transistor (BJT) with appropriate drive circuitry can be used according to the teachings of the present invention. In the illustrated example, each one of the plurality of current sources (506, 510, 514) is coupled to remove a current of different value from a node 570 when the corresponding enable signal is logic low. For example, current source 506 removes a current $I_1$ from node 570 when enable signal $EN_1$ 536 is logic low whereas current source 510 removes a current $I_2$ from node 570 when enable signal $EN_2$ 538 is logic low. Reference current source 530, however, is coupled to provide a reference current $I_{REF}$ to node 570 when reference enable signal $EN_{REF}$ 544 is logic low. In one embodiment, the reference current $I_{REF}$ is greater than the sum of currents $I_1$, $I_2$ to $I_M$.

It is further illustrated in FIG. 5 that timing control signal generator 520 includes a ramp generator 534 to generate a plurality of ramp signals ($V_{1R}$ 562, $V_{2R}$ 564, $V_{MR}$ 566) and a plurality of comparators (582, 584, 586) to control the duration that each one of plurality of current sources (506, 510, 514) is enabled in response to a voltage sense signal $V_{SEN}$ 552 and a corresponding one of plurality of ramp signals ($V_{1R}$ 562, $V_{2R}$ 564, $V_{MR}$ 566). In one example, the output of each one of the plurality of comparators (582, 584, 586) is logic low when the corresponding ramp signal is less than voltage sense signal $V_{SEN}$ 552 and the output of each one of plurality of comparators (582, 584, 586) becomes logic high when the corresponding ramp signal becomes equal to or greater than voltage sense signal $V_{SEN}$ 552. Further included in the example timing control signal generator 520 are a plurality of logic circuits (572, 574, 576) coupled between the output of each one of the plurality of comparators (582, 584, 586) and the corresponding one of the plurality of switched weighted current sources (507, 511, 515) to selectively couple each one of the plurality of comparators (582, 584, 586) to corresponding one of enable signals $EN_1$ 536, $EN_2$ 538 to $EN_M$ 540 (and hence, to corresponding one of the plurality of switched weighted current sources (507, 511, 515)) in response to a read enable signal $U_{REN}$ 558 and a reset signal $U_{RES}$ 556. In one embodiment, each one of the plurality of logic circuits (572, 574, 576) comprises an inverter having an output coupled to an input of a three-input OR gate. In operation, when read enable signal $U_{REN}$ 558 is logic high (during an active period of read enable signal) and reset signal $U_{RES}$ 556 is logic low, each one of the plurality of logic circuits (572, 574, 576) sets the corresponding enable signal to the output of the corresponding one of the plurality of comparators (582, 584, 586). When read enable signal $U_{REN}$ 558 is logic low and/or reset signal $U_{RES}$ 556 is logic high, each one of the plurality of logic circuits (572, 574, 576) sets the corresponding enable signal to logic high and hence, disables the corresponding one of the plurality of switched weighted current sources (507, 511, 515).

As further shown, timing control signal generator 520 also includes a reference comparator 588 coupled to control the duration that reference current source 530 is enabled in response to the reference signal $V_{REF}$ and ramp signal $V_{MR}$ 566. In one example, output of reference comparator 588 is logic low when ramp signal $V_{MR}$ 566 is less than the reference signal $V_{REF}$ and output of reference comparator 588 becomes logic high when the corresponding ramp signal becomes equal to or greater than the reference signal $V_{REF}$. Additionally, in the illustrated example, a reference logic circuit 578 is coupled between the output of reference comparator 588 and switched reference current source 531 to selectively couple reference comparator 588 to reference enable signal $EN_{REF}$ 544 (and hence, to switched reference current source 531) in response to read enable signal $U_{REN}$ 558 and reset signal $U_{RES}$ 556. In one embodiment, reference logic circuit 578 comprises an inverter having an output coupled to an input of a three-input NOR gate. In operation, when read enable signal $U_{REN}$ 558 is logic low and/or reset signal $U_{RES}$ 556 is logic high, reference logic circuit 578 sets reference enable signal $EN_{REF}$ 544 to logic high and when read enable signal $U_{REN}$ 558 is logic high and reset signal $U_S$ 556 is logic low, reference logic circuit 578 sets reference enable signal $EN_{REF}$ 544 to output of reference comparator 588.

Figure 6A:
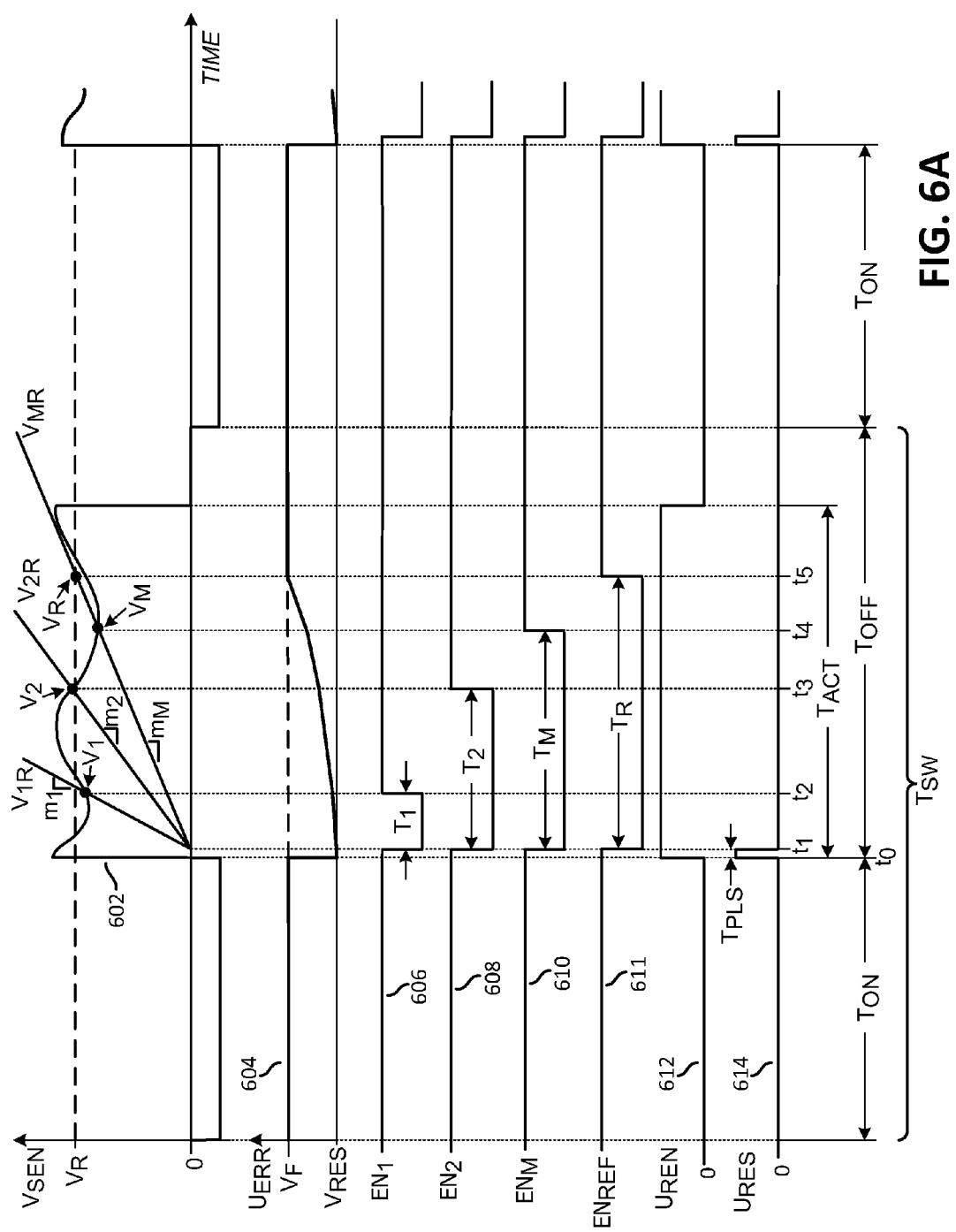
FIG. 6A is a timing diagram showing example waveforms for various signals that are associated with the switched averaging error amplifier illustrated in FIG. 5 in accordance with the teachings of the present invention.

FIG. 6A shows example waveforms for various signals that are associated with switched averaging error amplifier 546 according to the teachings of the present invention. These waveforms share many similarities with the waveforms of FIG. 4A. Waveforms 606, 608 and 610 are one possible representation of enable signals $EN_1$ 536, $EN_2$ 538 to $EN_M$ 540 respectively. In one example, the duration each one of enable signals $EN_1$ 536 (606), $EN_2$ 538 (608) to $EN_M$ 540 (610) is logic low represents the time interval between the falling edge of the reset pulse and a corresponding one of a plurality of voltage sense signal $V_{SEN}$ 552 (602) samples. For example, enable signal $EN_1$ 536 (606) is logic low for a time period $T_1$ which represents the time interval between the falling edge of the reset pulse and a voltage sense signal $V_{SEN}$ 552 (602) sample $V_1$, enable signal $EN_2$ 538 (608) is logic low for a time period $T_2$ which represents the time interval between the falling edge of the reset pulse and a voltage sense signal $V_{SEN}$ 552 (602) sample $V_2$, etc. Waveform 612 is one possible representation of reference enable signal $EN_{REF}$ 544 (611). As waveforms 602 and 612 further illustrate, reference enable signal $EN_{REF}$ 544 (611) is logic low for a time period $T_R$ which represents a time interval that it takes for ramp signal $V_{MR}$ 566 to reach the reference signal $V_{REF}$ from the falling edge of the reset pulse. In other words, reference comparator 588 sets the duration that reference enable signal $EN_{REF}$ 544 is logic low by comparing ramp signal $V_{MR}$ 566 with the reference signal $V_{REF}$.

Operation of signal averaging circuit 546 is now explained with reference to FIG. 5 and FIG. 6A. As shown, read enable signal $U_{REN}$ 558 (612) is logic low during on-time $T_{ON}$ and as such, switch $SW_{CTR}$ 524 blocks current conduction between plurality of switched weighted current sources (507, 511, 515), switched reference current source 531 and storage circuit 526, allowing error signal $U_{ERR}$ 560 (604) to remain at a substantially constant positive voltage until off-time $T_{OFF}$ begins at time $t_0$. Waveforms 612 and 614 further illustrate that both read enable signal $U_{REN}$ 558 and reset signal $U_{RES}$ 556 transition from logic low to logic high at time $t_0$. Transition of reset signal $U_S$ 556 (614) from logic low to logic high couples reset circuit 518 to storage circuit 526 and sets error signal $U_{ERR}$ 560 (604) to the reset voltage $V_{RES}$. Additionally, when reset signal $U_{RES}$ 556 (614) is logic high, timing control signal generator 520 sets each one of enable signals $EN_1$ 536 (606), $EN_2$ 538 (608) to $EN_M$ 540 (610) and reference enable signal $EN_{REF}$ 544 (611) to logic high, thereby disabling each one of the plurality of current sources (506, 510 and 514) and reference current source 530. As further shown in FIG. 6A, reset signal $U_S$ 556 (614) stays at logic high for the duration $T_{PLS}$ and transitions back to logic low at time $t_1$. Accordingly, error signal $U_{ERR}$ 560 (604) stays at the reset voltage $V_{RES}$ until time $t_1$ which is when enable signals $EN_1$ 536 (606), $EN_2$ 538 (608) to $EN_M$ 540 (610) and reference enable signal $EN_{REF}$ 544 (611) become logic low and enable each one of the plurality of current sources (506, 510 and 514) along with reference current source 530. In operation, each one of the plurality of current sources (506, 510, 514) removes current from node 570 whereas reference current source 530 provides the reference current $I_{REF}$, which in the example signal averaging circuit 546 is greater than the total current removed by the plurality of current sources (506, 510, 514), to node 570. As such, net current, which is represented by a control switch current $I_{SW}$ 542, enters storage circuit 526 after reset signal $U_{RES}$ 556 (614) transitions from logic high to logic low and charges storage circuit 526. As a result, error signal $U_{ERR}$ 560 (604) begins to increase. In the illustrated example, timing control signal generator 520 transitions enable signals $EN_1$ 536 (606), $EN_2$ 538 (608) to $EN_M$ 540 (610) and reference enable signal $EN_{REF}$ 544 (611) from logic low to logic high sequentially, thereby disabling respective current sources sequentially as well. For example, current source 506 is associated with enable signal $EN_1$ 536 (606) and is disabled at time $t_2$ (hence, storage circuit 526 charges for time period $T_1$ at a first charging rate), current source 510 is associated with enable signal $EN_2$ 538 (608) and is disabled later at time $t_3$ (hence, storage circuit 526 charges longer for time period $T_2$ at a second charging rate that is greater than the first charging rate), and so on. In the illustrated example, reference current source 530 is disabled latest at time $t_5$ and charges storage circuit 526 for time period $T_R$. Therefore, the rate at which error signal $U_{ERR}$ 560 (604) increases varies during the active period of read enable signal $T_{ACT}$. More specifically, the rate of change of error signal $U_{ERR}$ 560 (604) increases as each one of the plurality of current sources (506, 510, 514) is sequentially disabled. For example, between time $t_1$ and time $t_2$ all of the plurality of current sources (506, 510, 514) are enabled to remove current from node 570 whereas reference current source 530 is enabled to provide current to node 570. Accordingly, control switch current $I_{SW}$ 542 is at the lowest value and error signal $U_{ERR}$ 560 (604) increases at the lowest rate. Between time $t_2$ and time $t_3$ current source 506 that corresponds to enable signal $EN_1$ 536 (606) is disabled, resulting in an increase in control switch current $I_{SW}$ 542 and hence, allowing error signal $U_{ERR}$ 560 (604) to increase at a higher rate during this time period. It should be noted that in an alternative embodiment, timing control signal generator 520 can be configured differently to transition enable signals $EN_1$ 536 (606), $EN_2$ 538 (608) to $EN_M$ 540 (610) from logic high to logic low (instead of logic low to logic high) sequentially, thereby enabling respective current sources sequentially as well. In this configuration, the rate of change of error signal $U_{ERR}$ 560 (604) decreases as each one of the plurality of current sources (506, 510, 514) is sequentially enabled to remove current from node 570 and subsequently, reduce control switch current $I_{SW}$ 542.

Referring back to FIG. 5, it is further illustrated that error signal $U_{ERR}$ 560 (604) continues to increase until reference current source 530 is disabled at time $t_5$ which also is when error signal $U_{ERR}$ 560 (604) reaches a final value $V_F$. From time $t_5$ until the beginning active period of read enable signal $T_{ACT}$ of next period $T_{SW}$, error signal $U_{ERR}$ 560 (604) remains substantially constant at the final value $V_F$ because all of the plurality of current sources (506, 510, 514) and reference current source 530 are disabled and there is no current conduction between the plurality of switched weighted current sources (507, 511, 515), switched reference current source 531, and storage circuit 526. In the illustrated example, the final value $V_F$ is equal to the net amount of charge provided to storage circuit 526 during active period of read enable signal $T_{ACT}$ divided by a capacitance of storage circuit 526 and can be expressed with the following equation:

$$V_F = \frac{1}{C}[(I_{REF}T_R) - (I_1T_1 + I_2T_2 + \ldots + I_MT_M)] \quad (4)$$

where C is the capacitance of storage circuit 526. Substituting actual current values for currents $I_2$ to $I_M$ and $I_{REF}$, equation (4) can be rewritten as:

$$V_F = \frac{I}{MC}(Ma_MT_R - a_1T_1 - a_2T_2 - \ldots - a_MT_M) \quad (5)$$

In the illustrated example, timing control signal generator 520 generates M ramp signals $V_{1R}$ 562, $V_{2R}$ 564 to $V_{MR}$ 566, which start to ramp from zero volts at time $t_1$ with respective slopes $m_1, m_2$ to $m_M$, to set the time period between the falling edge of the reset pulse and each one of the plurality of voltage sense signal $V_{SEN}$ 552 (602) samples. For example, ramp signal $V_{1R}$ 562 is used to set time period $T_1$ between the falling edge of the reset pulse and voltage sense signal $V_{SEN}$ 552 (602) sample $V_1$. Similarly, ramp signal $V_{2R}$ 564 is used to set time period $T_2$ between the falling edge of the reset pulse and voltage sense signal $V_{SEN}$ 552 (602) sample $V_2$. Therefore, time periods $T_1, T_2$ and $T_M$ can be expressed mathematically as the ratio of corresponding voltage sense signal $V_{SEN}$ 552 sample to the slope of respective ramp signal. For example, $T_1$ equals input signal sample $V_1$ divided by slope of ramp signal $V_{1R}$ 562 (i.e., $V_1/m_1$), $T_2$ equals input signal sample $V_2$ divided by slope of ramp signal $V_{2R}$ 564 (i.e., $V_2/m_2$), and so on. Using this information, equation (5) can be rewritten as follows:

$$V_F = \frac{I}{C}\left[a_M\frac{V_{REF}}{m_M} - \frac{1}{M}\left(a_1\frac{V_1}{m_1} + a_2\frac{V_2}{m_2} + \ldots + a_M\frac{V_M}{m_M}\right)\right] \quad (6)$$

As seen in equation (6), the final value $V_F$ is representative of the weighted combination of the plurality of voltage sense signal $V_{SEN}$ 552 (602) samples and the reference signal $V_{REF}$ during active period of read enable signal $T_{ACT}$. Having different values for coefficients $a_1, a_2$ to $a_M$ and for slopes $m_1, m_2$ to $m_M$ may produce a different weighting factor for each one of the plurality of voltage sense signal $V_{SEN}$ 552 (602) samples and the reference signal $V_{REF}$ and hence, may result in a different sum. In one example, coefficients $a_1, a_2$ to $a_M$ and slopes $m_1, m_2$ to $m_M$ can be chosen in a specific manner such that the final value $V_F$ represents the scaled difference between the reference signal $V_{REF}$ and an average value of the plurality of voltage sense signal $V_{SEN}$ 552 (602) samples. Specifically, when the weighting factor for each one of the plurality of voltage sense signal $V_{SEN}$ 552 (602) samples and the reference signal $V_{REF}$ such $a_1/m_1, a_2/m_2, a_M/m_M$, etc. is chosen identical, the final value $V_F$ represents the difference between the reference signal $V_{REF}$ and the average value of the plurality of voltage sense signal $V_{SEN}$ 552 (602) samples scaled by the weighting factor. Therefore, the final value $V_F$ in the example of FIG. 5 may be considered an error signal.

Figure 6B:
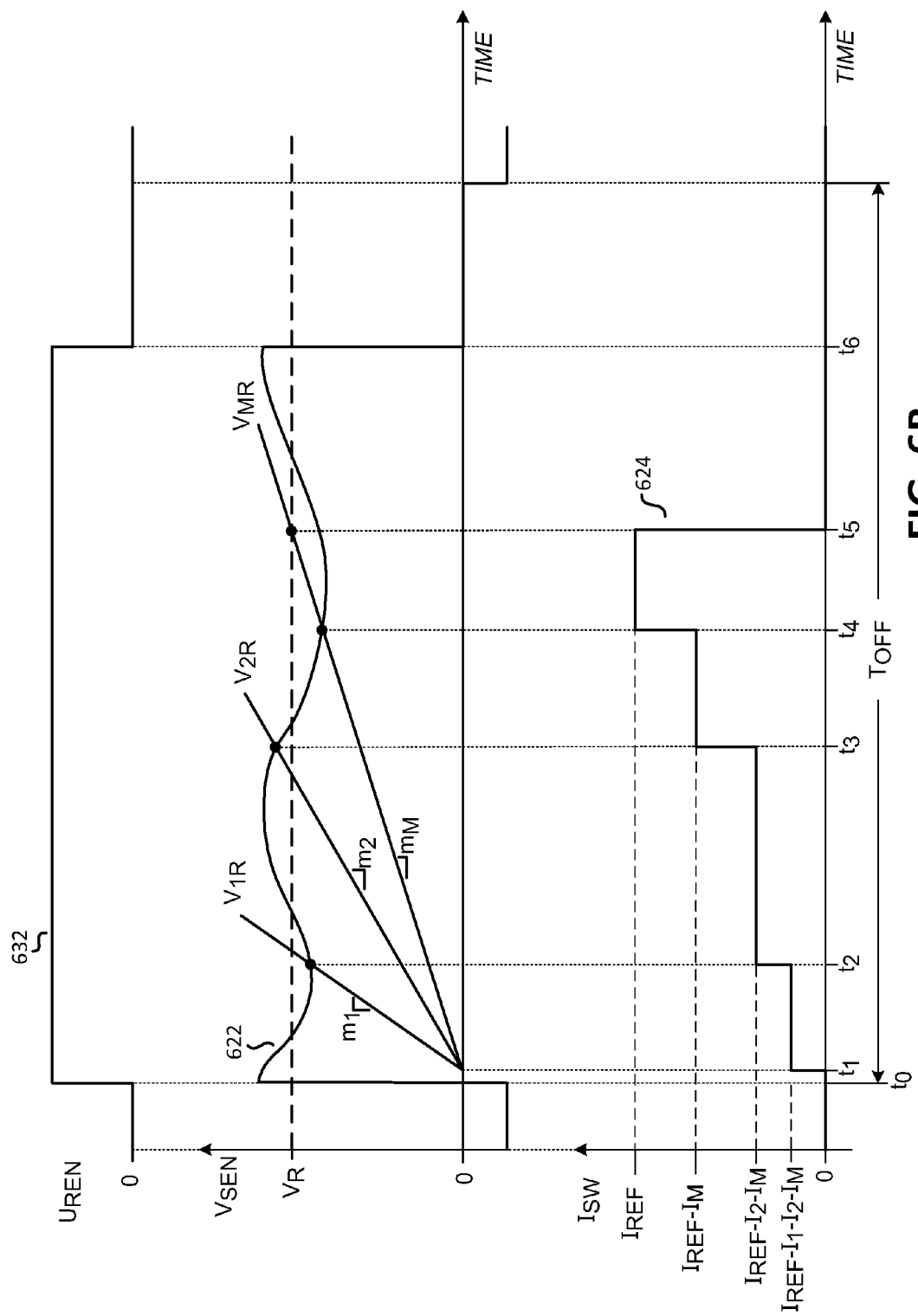
FIG. 6B is a diagram showing expanded views of various example waveforms illustrated in FIG. 6A in accordance with the teachings of the present invention.

FIG. 6B shows expanded views of various example waveforms illustrated in FIG. 6A in accordance with the teachings of the present invention. More particularly, waveform 622 is one possible representation of voltage sense signal $V_{SEN}$ 552 during off-time $T_{OFF}$, waveform 624 is one possible representation of control switch current $I_{SW}$ 542 during off-time $T_{OFF}$ and waveform 632 is one possible representation of read enable signal $U_{REN}$ 558 during off-time $T_{OFF}$. As previously mentioned, when read enable signal $U_{REN}$ 558 (612) is logic high and reset signal U 556 (614) transitions from logic high to logic low ramp signals $V_{1R}$ 562, $V_{2R}$ 564 to $V_{MR}$ 566 start to ramp from zero volts with respective slopes of $m_1, m_2$ to $m_M$. Each one of ramp signals $V_{1R}$ 562, $V_{2R}$ 564, to $V_{MR}$ 566 is associated with one of enable signals $EN_1$ 536, $EN_2$ 538 to $EN_M$ 540 and in turn, controls the duration that the corresponding one of the plurality of current sources (506, 510 and 514) is enabled during active period of read enable signal $T_{ACT}$. In the example signal averaging circuit 546, this is accomplished by comparing each one of ramp signals $V_{1R}$ 562, $V_{2R}$ 564 to $V_{MR}$ 566 with voltage sense signal $V_{SEN}$ 552 (622) such that when one of the ramp signals is less than voltage sense signal $V_{SEN}$ 552 (622), a corresponding one of the plurality of current sources (506, 510 and 514) is enabled and when one of ramp signals $V_{1R}$ 562, $V_{2R}$ 564 to $V_{MR}$ 566 becomes equal to or greater than voltage sense signal $V_{SEN}$ 552 (622), a corresponding one of plurality of current sources (506, 510 and 514) is disabled. As an example, ramp signal $V_{1R}$ 562 is associated with enable signal $EN_1$ 536 (and hence, with current source 506) and controls the duration that current source 506 is enabled during active period of read enable signal $T_{ACT}$, such that when ramp signal $V_{1R}$ 562 is less than voltage sense signal $V_{SEN}$ 552 (622) current source 506 is enabled, and when $V_{1R}$ 562 becomes equal to voltage sense signal $V_{SEN}$ 552 (622) current source 506 is disabled. Furthermore, in the example switched averaging error amplifier 546, ramp signal $V_{MR}$ 566 is also associated with reference enable signal $EN_{REF}$ 544 and controls the duration that reference current source 530 is enabled during active period of read enable signal $T_{ACT}$ by comparing ramp signal $V_{MR}$ 566 with the reference signal $V_{REF}$. When ramp signal $V_{MR}$ 566 is less than the reference signal $V_{REF}$, reference current source 530 is enabled, and when ramp signal $V_{MR}$ 566 becomes equal to or greater than the reference signal $V_{REF}$, reference current source 530 is disabled.

As further shown in FIG. 6B, slopes $m_1, m_2$ to $m_M$ are different from each other. That is, slope $m_1$ of ramp signal $V_{1R}$ 562 is greater than slope $m_2$ of ramp signal $V_{2R}$ 564 and slope $m_2$ of ramp signal $V_{2R}$ 564 is greater than slope $m_M$ of ramp signal $V_{MR}$ 566. Therefore, in the illustrated example, each one of the plurality of current sources (506, 510 and 514) and reference current source 530 is disabled sequentially, causing control switch current $I_{SW}$ 542 (624) to increase in stepwise fashion since control switch current $I_{SW}$ 542 (624) is equal to the reference current $I_{REF}$ provided by reference current source 530 minus the sum of currents removed by each one of plurality of current sources (506, 510 and 514). To illustrate, between time $t_1$ and time $t_2$, all of the plurality of current sources 506, 510, 514 and reference current source 530 are enabled and control switch current $I_{SW}$ 542 is equal to the reference current $I_{REF}$ minus the sum of currents $I_1$, $I_2$ to $I_M$. At time $t_2$, ramp signal $V_{1R}$ 562 becomes equal to voltage sense signal $V_{SEN}$ 552 (622) and the corresponding current source 506 is disabled. As such, control switch current $I_{SW}$ 542 is equal to the reference current $I_{REF}$ minus the sum of currents $I_2$ to $I_M$ between time $t_2$ and time $t_3$. At time $t_3$, ramp signal $V_{2R}$ 564 becomes equal to voltage sense signal $V_{SEN}$ 552 (622) and the corresponding current source 510 is disabled, making control switch current $I_{SW}$ 542 equal to the reference current $I_{REF}$ minus current $I_M$ between time $t_3$ and time $t_4$.

Furthermore, at time $t_4$, ramp signal $V_{MR}$ 566 becomes equal to voltage sense signal $V_{SEN}$ 552 (622) and the corresponding current source 514 is disabled, making control switch current $I_{SW}$ 542 (624) equal to the reference current $I_{REF}$. At time $t_5$, ramp signal $V_{MR}$ 566 becomes equal to the reference signal $V_{REF}$ and reference current source 530 is disabled. From thereon (time $t_5$) until read enable signal $U_{REN}$ 558 (632) transitions to logic low at time $t_6$ (i.e., end of active period of read enable signal $T_{ACT}$), there is no current source available to provide/remove current and control switch current $I_{SW}$ 542 (624) becomes substantially zero. From time $t_6$ until the end of off-time $T_{OFF}$, read enable signal $U_{REN}$ 558 (632) is logic low and control switch $SW_{CTR}$ 524 is disabled. Consequently, control switch current $I_{SW}$ 542 (624) remains at substantially zero until the beginning of active period of read enable signal $T_{ACT}$ of next period $T_{SW}$. It is in this manner that control current switch $I_{SW}$ 542 (624) is adjusted to charge storage circuit 526 to the final value $V_F$ that is representative of weighted combination of the plurality of voltage sense signal $V_{SEN}$ 552 (622) samples and the reference signal $V_{REF}$ during active period of read enable signal $T_{ACT}$.

Figure 7:
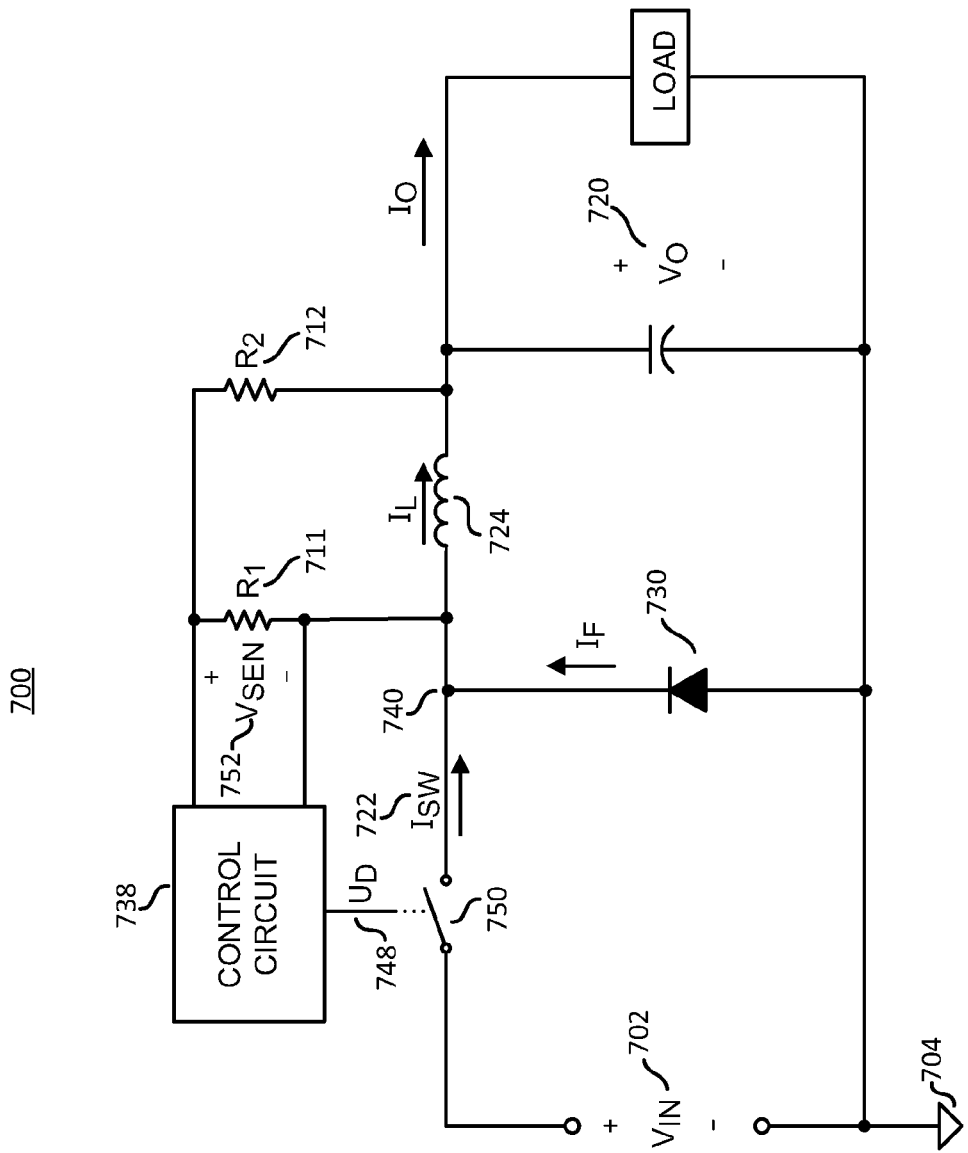
FIG. 7 is a circuit diagram illustrating another example of a power supply with a controller that can benefit from the teachings of the present invention.

FIG. 7 shows a circuit diagram illustrating another example of a power supply 700 that can benefit from the teachings of the present invention. In the illustrated example, control circuit 738 shares many aspects of operation with controller 138 described above. In one example, there is not an auxiliary winding on an energy transfer element 724 and control circuit 738 receives a voltage sense signal $V_{SEN}$ 752, which is coupled to energy transfer element 724. In operation, when a power switch 750 is closed (ON), power switch 750 conducts a switch current $I_{SW}$ 722 from an input voltage source $V_{IN}$ 702 to energy transfer element 724. When power switch 750 is open (OFF), the voltage at a node 740 drops to a value substantially equal to a ground voltage 704 minus a forward voltage drop across a freewheeling diode 730, which is coupled to energy transfer element 724, to sustain current in energy transfer element 724 during a feedback interval of power switch 750. In some cases, the feedback interval is the entire off-time of power switch 750 and in some other cases, the feedback interval is a portion of the off-time of power switch 750.

During the feedback interval, or equivalently while freewheeling diode 730 is conducting, the voltage across energy transfer element 724 is equal to an output voltage $V_O$ 720 plus the forward voltage drop across freewheeling diode 730 and therefore, is representative of output voltage 720. In the example power supply 700, the voltage across energy transfer element 724 is coupled to control circuit 738 through a resistor divider formed by resistors 711 and 712 as voltage sense signal $V_{SEN}$ 752 and thus, provides information representative of the output of power supply 700 only during the feedback interval. In other words, voltage sense signal $V_{SEN}$ 752 does not give any information about the output of power supply 700 during on-time of power switch 750. In one example, control circuit 738 includes switched averaging error amplifier 146 of controller 138 to generate a control signal in response to voltage sense signal $V_{SEN}$ 752 and a pulse width modulator such as PWM 144 of controller 138 to generate a drive signal 748 in response to the control signal to control the switching of power switch 750. In one example, the control signal is representative of a weighted combination of multiple samples of voltage sense signal $V_{SEN}$ 752 during the feedback interval. As such, in one example, the operation principle of control circuit 738 is very similar to that of controller 138.

Figure 8:
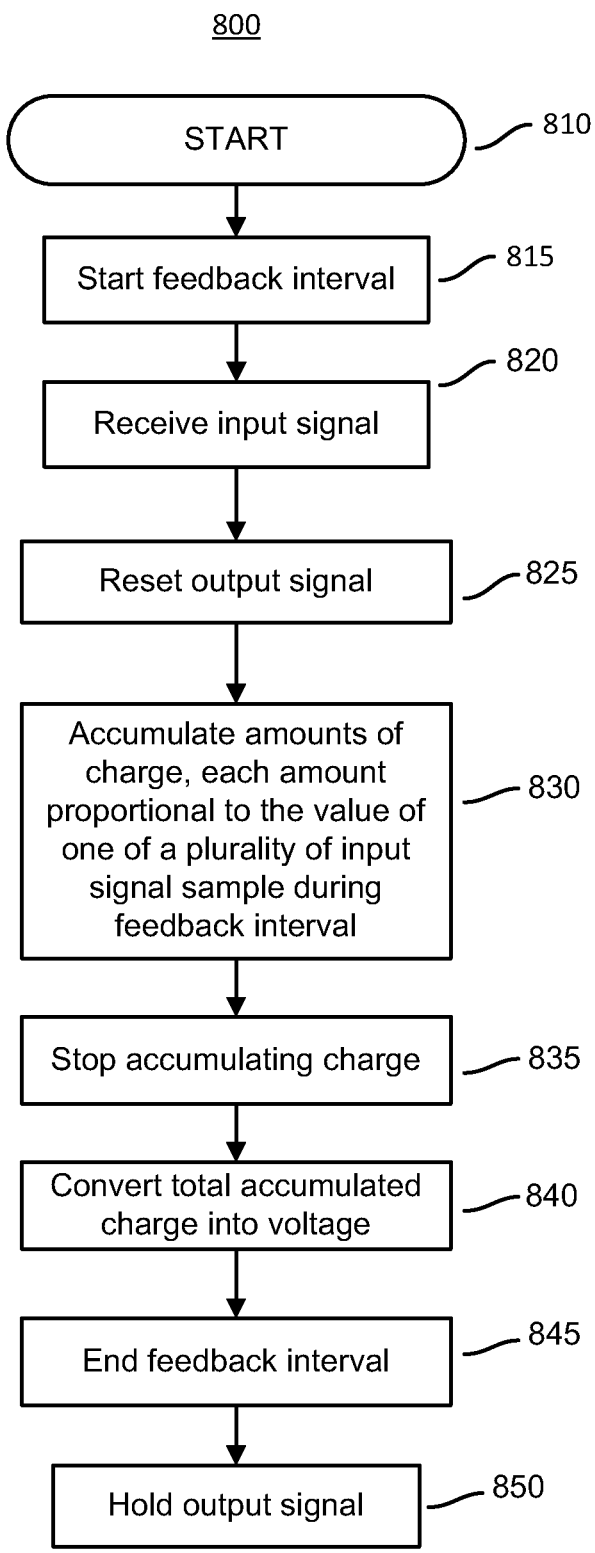
FIG. 8 is a flow diagram illustrating an example process for generating an output signal that is representative of a weighted combination of a plurality of input signal samples of a circuit in accordance with the teachings of the present invention.

FIG. 8 shows a flow diagram 800 illustrating a method for generating an output signal representative of a weighted combination of a plurality of input signal samples of a circuit, which in one example is a switched averaging error amplifier, according to the teachings of the present invention. At block 810, the switched averaging error amplifier starts to operate. At block 815, the switched averaging error amplifier starts a feedback interval during which the output signal is generated. In one example, this happens after the switched averaged error amplifier receives a read enable signal that is activated, i.e. when an active period of the read enable signal begins. In one example, the active period of the read enable signal is the duration that the read enable signal is logic high. Next, at block 820, the switched averaging error amplifier receives an input signal. At block 825, the output signal is set to a reset voltage, which in one example is substantially zero volts, i.e., the output signal is reset. At block 830, amounts of charge are accumulated where each amount is proportional to the value of one of a plurality of input signal samples during the feedback interval. In one embodiment, these charges are accumulated on a storage capacitor and the total charge stored in the storage capacitor represents a weighted combination of the plurality of the input signal samples which in one example corresponds to an average value of the plurality of input signal samples. In an alternative embodiment, amounts of charge can be removed from a store of charge such as, for example, a pre-charged capacitor where each amount is proportional to the value of one of the plurality of input signal samples during the feedback interval and the total remaining charge can represent the weighted combination of the plurality of input signal samples which in one example can correspond to the average value of the plurality of input signal samples. At block 835, the switched averaging error amplifier stops accumulating charge. At block 840, the total accumulated charge is converted into a voltage to be used as the output signal. At block 845, the switched averaging error amplifier ends the feedback interval and after that, at block 850, the output signal is held substantially constant.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. A signal averaging circuit, comprising:
a plurality of switched weighted current sources to generate a total amount of charge, wherein the total amount of charge is representative of a weighted sum of a plurality of input signal samples during an active period of a read enable signal;
a timing control signal generator coupled to receive an input signal and the read enable signal, the timing control signal generator is further coupled to sequentially switch the plurality of switched weighted current sources to adjust the total amount of charge in response to the input signal during the active period of the read enable signal, wherein the timing control signal generator comprises:
a ramp generator to generate a plurality of ramp signals; and
a plurality of comparators, wherein each one of the plurality of comparators is coupled to control a corresponding one of the plurality of switched weighted current sources in response to a comparison of a corresponding one of the plurality of ramp signals and the input signal; and
a storage circuit coupled to the plurality of switched weighted current sources to convert the total amount of charge into a voltage representative of an output signal.

2. The signal averaging circuit of claim 1, wherein the weighted sum represents a scaled average of the plurality of input signal samples.

3. The signal averaging circuit of claim 1 further comprising a reset circuit coupled to the storage circuit, wherein the output signal is coupled to be set to an initial value in response to the reset circuit at a beginning of the active period of the read enable signal.

4. The signal averaging circuit of claim 1, wherein the each one of the plurality of switched weighted current sources is coupled to sequentially conduct a respective weighted current coupled to the storage circuit in response to a respective enable signal coupled to be received from the timing control signal generator in response to the input signal and the read enable signal.

5. The signal averaging circuit of claim 1, wherein each one of the plurality of switched weighted current sources is coupled to charge the storage circuit in response to the timing control signal generator.

6. The signal averaging circuit of claim 1, wherein each one of the plurality of switched weighted current sources is coupled to discharge the storage circuit in response to the timing control signal generator.

7. The signal averaging circuit of claim 1, wherein the storage circuit comprises a capacitor.

8. The signal averaging circuit of claim 1, wherein the timing control signal generator further comprises a plurality of logic circuits, wherein each one of the plurality of logic circuits is coupled between an output of a corresponding one of the comparators and a corresponding one of the plurality of switched weighted current sources, wherein each one of the plurality of logic circuits is coupled to control the corresponding one of the plurality of switched weighted current sources in response to the output of the corresponding one of the comparators and the read enable signal.

9. The signal averaging circuit of claim 1 further comprising a switched reference current source coupled to the storage circuit to generate a reference charge representative of a reference signal, wherein the switched reference current source is further coupled to adjust the total amount of charge such that the total amount of charge represents the difference between the reference charge and the weighted sum of the plurality of input signal samples during the active period of the read enable signal.

10. The signal averaging circuit of claim 9, wherein the timing control signal generator further comprises a reference comparator coupled to control the switched reference current source in response to a comparison of the reference signal and one of a plurality of ramp signals.

11. The signal averaging circuit of claim 10, wherein the timing control signal generator further comprises a reference logic circuit coupled between the switched reference current source and an output of the reference comparator.

12. The signal averaging circuit of claim 1, wherein the signal averaging circuit is included in a switched averaging error amplifier further including an error amplifier coupled to the signal averaging circuit to generate an error signal in response to a difference between a reference signal and the output signal of the signal averaging circuit.

13. A controller for use in a power converter, comprising:
a feedback interval generator coupled to receive a current sense signal representative of a current through a power switch of the power converter, the feedback interval generator coupled to generate a read enable signal in response to the current sense signal, wherein the read enable signal is representative of a feedback portion of an input signal, wherein the input signal is representative of an output of the power converter;
a switched averaging error amplifier, comprising:
a plurality of switched weighted current sources to generate a total amount of charge, wherein the total amount of charge is representative of a weighted sum of a plurality of input signal samples during an active period of the read enable signal;
a timing control signal generator coupled to receive the input signal and the read enable signal, the timing control signal generator is further coupled to sequentially switch the plurality of switched weighted current sources to adjust the total amount of charge in response to the input signal during the active period of the read enable signal, wherein timing control signal generator comprises:
a ramp generator to generate a plurality of ramp signals; and
a plurality of comparators, wherein each one of the plurality of comparators is coupled to control a corresponding one of the plurality of switched weighted current sources in response to a comparison of a corresponding one of the plurality of ramp signals and the input signal;
a storage circuit coupled to the plurality of switched weighted current sources to convert the total amount of charge into a voltage representative of an output signal; and
an error amplifier coupled to generate an error signal in response to a difference between a reference signal and the output signal; and
a pulse width modulator coupled to the switched averaging error amplifier to generate a drive signal coupled to control the power switch, the drive signal coupled to be generated in response to the error signal from the switched averaging error amplifier.

14. The controller of claim 13, wherein the output signal represents a scaled average of the plurality of input signal samples.

15. The controller of claim 13, wherein the switched averaging error amplifier further comprises a reset circuit coupled to the storage circuit, wherein the output signal is coupled to be set to an initial value in response to the reset circuit at a beginning of the active period of the read enable signal.

16. The controller of claim 13, wherein the controller further comprises an oscillator coupled to generate an oscillating signal coupled to be received by the pulse width modulator.

17. The controller of claim 13, wherein the feedback interval generator is further coupled to generate a reset signal coupled to control the reset circuit to set the output signal to an initial value at a beginning of the active period of the read enable signal.

18. The controller of claim 13 wherein each one of the plurality of switched weighted current sources is coupled to sequentially conduct a respective weighted current coupled to the storage circuit in response to a respective enable signal coupled to be received from the timing control signal generator in response to the input signal and the read enable signal.

19. The controller of claim 13, wherein each one of the plurality of switched weighted current sources is coupled to charge the storage circuit in response to the timing control signal generator.

20. The controller of claim 13, wherein each one of the plurality of switched weighted current sources is coupled to discharge the storage circuit in response to the timing control signal generator.

21. The controller of claim 13, wherein the timing control signal generator further comprises a plurality of logic circuits, wherein each one of the plurality of logic circuits is coupled between a corresponding one of the comparators and a corresponding one of the plurality of switched weighted current sources, wherein each one of the plurality of logic circuits is coupled to control the corresponding one of the plurality of switched weighted current sources in response to an output of the corresponding one of the comparators and the read enable signal.

22. A controller for use in a power converter, comprising:
a feedback interval generator coupled to receive a current sense signal representative of a current through a power switch of the power converter, the feedback interval generator coupled to generate a read enable signal in response to the current sense signal, wherein the read enable signal is representative of a feedback portion of an input signal, wherein the input signal is representative of an output of the power converter;
a switched averaging error amplifier, comprising:
a plurality of switched weighted current sources to generate a total amount of charge, wherein the total amount of charge is representative of a weighted sum of a plurality of input signal samples during an active period of the read enable signal;
a timing control signal generator coupled to receive the input signal and the read enable signal, the timing control signal generator is further coupled to sequentially switch the plurality of switched weighted current sources to adjust the total amount of charge in response to the input signal during the active period of the read enable signal, wherein the timing control signal generator comprises:
a ramp generator to generate a plurality of ramp signals;
a plurality of comparators, wherein each one of the plurality of comparators is coupled to control a corresponding one of the plurality of switched weighted current sources in response to a comparison of a corresponding one of the plurality of ramp signals and the input signal; and
a reference comparator coupled to control the switched reference current source in response to the a comparison of the reference signal and one of the plurality of ramp signals;
a storage circuit coupled to the plurality of switched weighted current sources to convert the total amount of charge into a voltage representative of an error signal; and
a switched reference current source coupled to the storage circuit to generate a reference charge representative of a reference signal, wherein the switched reference current source is further coupled to adjust the total amount of charge such that the total amount of charge represents the difference between the reference charge and the weighted sum of the plurality of input signal samples during the active period of the read enable signal; and
a pulse width modulator coupled to the switched averaging error amplifier to generate a drive signal coupled to control the power switch, the drive signal coupled to be generated in response to the error signal from the switched averaging error amplifier.

23. The controller of claim 22 wherein the timing control signal generator further comprises a reference logic circuit coupled between the switched reference current source and an output of the reference comparator.

* * * * *